(12) United States Patent
Nakayama

(10) Patent No.: US 6,567,019 B2
(45) Date of Patent: May 20, 2003

(54) DATA PROCESSING APPARATUS AND METHOD

(75) Inventor: Tadayoshi Nakayama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/927,405

(22) Filed: Aug. 13, 2001

(65) Prior Publication Data

US 2002/0021233 A1 Feb. 21, 2002

(30) Foreign Application Priority Data

Aug. 14, 2000 (JP) ........................................ 2000-246017

(51) Int. Cl.[7] .................................................. H03M 7/40
(52) U.S. Cl. .............................. 341/67; 341/50; 341/51; 709/246
(58) Field of Search ............................ 341/67, 50, 51, 341/86, 107, 106, 63; 709/246

(56) References Cited

U.S. PATENT DOCUMENTS 4,286,256 A * 8/1981 Langdon et al. ............. 341/107
4,973,961 A   11/1990 Chamzas et al. ............. 341/51
5,729,690 A * 3/1998 Jeong et al. ................. 709/246

FOREIGN PATENT DOCUMENTS

EP    0 849 709    * 6/1998
JP    7-123228    12/1995    ............ H03M/7/40

* cited by examiner

Primary Examiner—Jean Bruner Jeanglaude
(74) Attorney, Agent, or Firm—Fitzpatrick, Cella, Harper & Scinto

(57) ABSTRACT

A code concatenating unit incorporates carry signals in a retained remaining code, and couples thereto an inputted variable length code to generate a concatenated code. An undefined code length detection unit, and first to third computation units acquire the code length of a defined code portion that is not influenced by the carry signal and output the same. As long as the whole of the concatenated code is an undefined code, a cumulative addition/subtraction unit adds cumulatively its code length, and a code generation unit generates and outputs a predetermined defined code with the cumulative value as its code length.

61 Claims, 27 Drawing Sheets

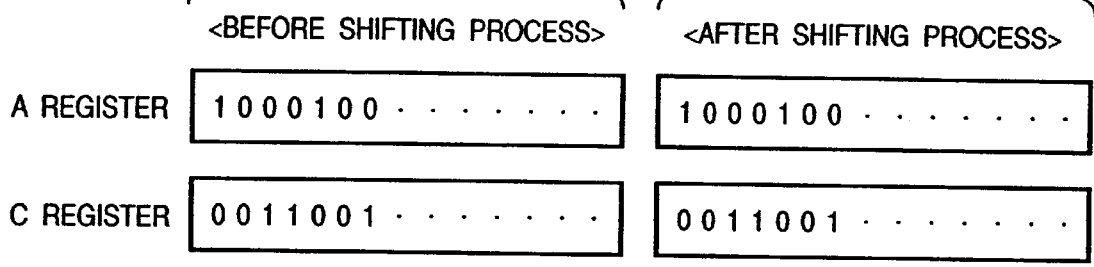
PRIOR ART
FIG. 1A
PRIOR ART
FIG. 1B
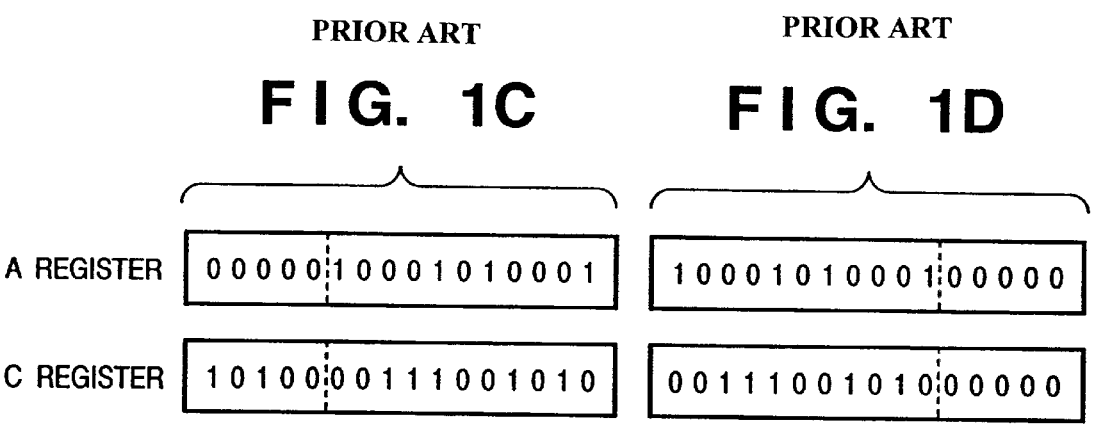
PRIOR ART
FIG. 1C
PRIOR ART
FIG. 1D
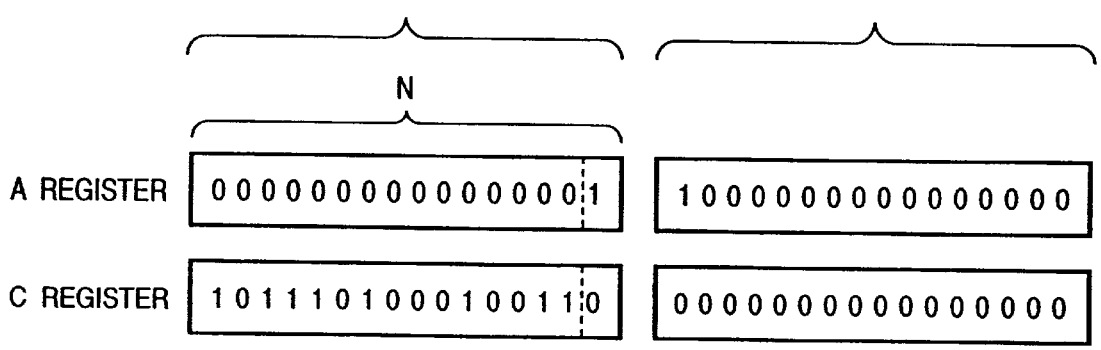
PRIOR ART
FIG. 1E
PRIOR ART
FIG. 1F

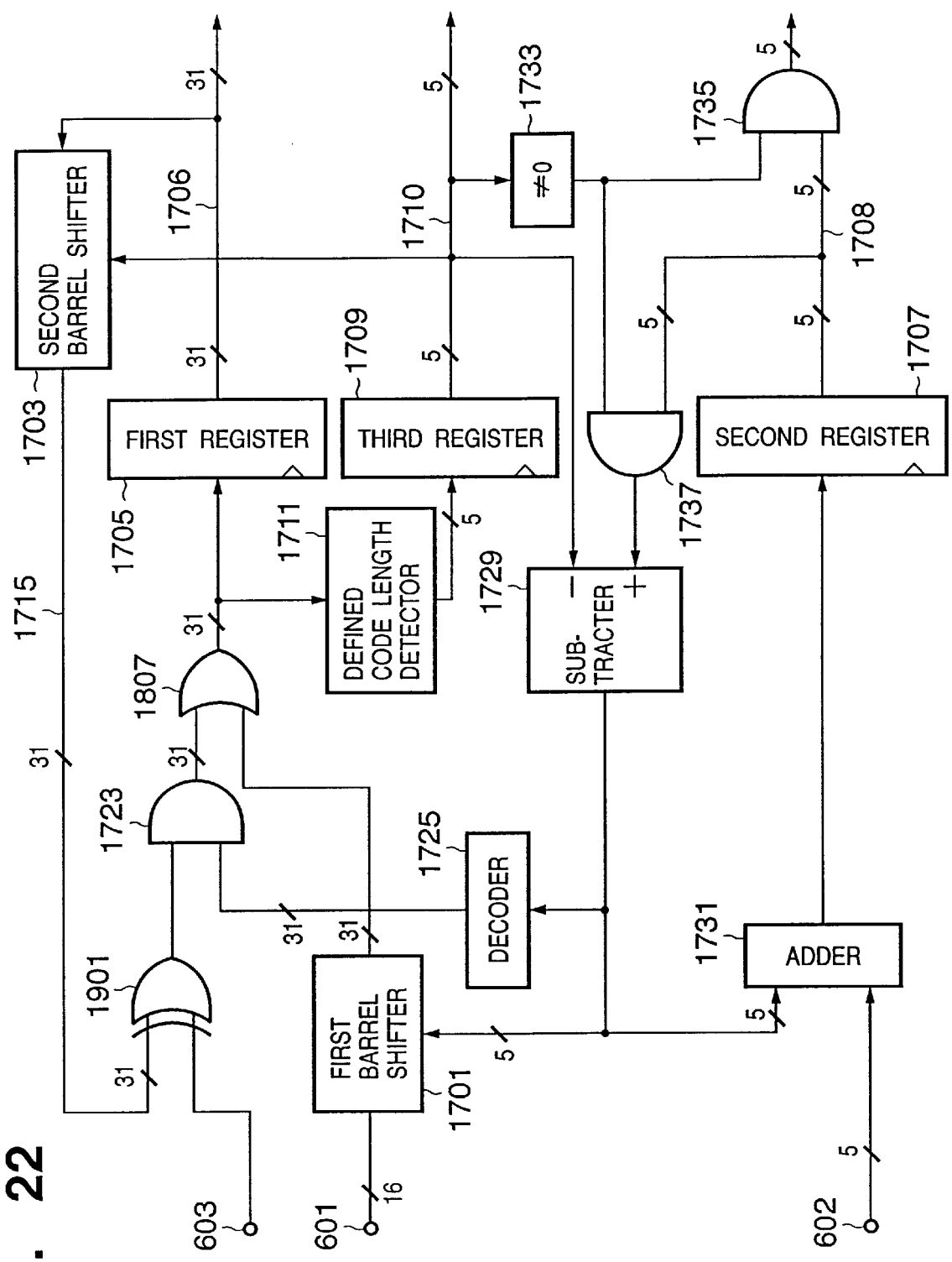
F I G. 22

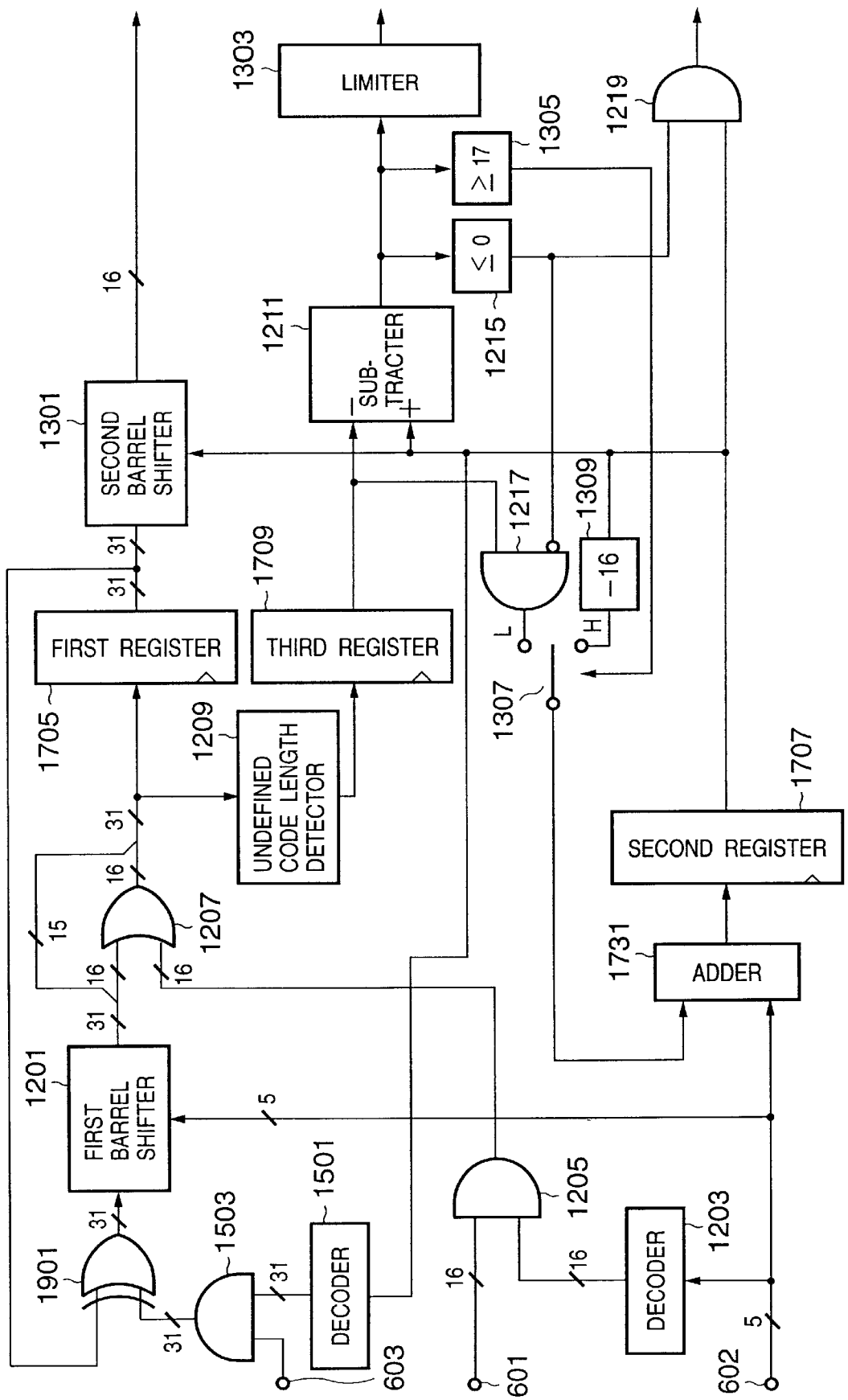
F I G. 27

DATA PROCESSING APPARATUS AND METHOD

FIELD OF THE INVENTION

The present invention relates to a data processing apparatus and method for processing a variable length code with carry signals.

BACKGROUND OF THE INVENTION

Generally, an arithmetic unit in an arithmetic coding unit generates a variable length code each time the arithmetic coding of one symbol is performed, and generates a carry signal such as a carry signal and a borrow signal depending on the contents of computation. At this time, because the code has a variable length, code length information for indicating the length of the generated code is outputted at the same time. The length of the variable length code is between 0 and a certain value N. The value N depends on register length in the arithmetic coding unit, called an augend register or a code interval register (hereinafter referred to as A register).

Typical arithmetic coding systems include the JBIG system standardized by the JBIG (Joint Bi-level Image Experts Group) that is an agent of the ITU (International Telecommunications Union), and the Q-coder proposed by IBM Corporation. In the following description, the arithmetic coding system will not be limited to a specific one, assuming that general arithmetic coding is used. However, technical terms may be used inevitably for convenience of explanation because terms and concepts are not popular, and in this case, the JBIG that is a standard system will be applied.

Whether or not the value of the A register is within a predetermined range is checked (it is usually considered that the value falls within a predetermined range if the value of the most significant bit of this register A is '1') each time arithmetic coding of one symbol is performed, and if the value falls within the range, nothing is done and then arithmetic coding is performed for a next symbol. In this case, the generated code length is 0 bit. In contrast, if the value does not fall within the range, shift processing is performed so that the value of the A register falls within the predetermined range, and at the same time shift processing is performed for a cord register (hereinafter referred to as C register) being a register based on which codes are generated. This is usually referred to as normalization processing (hereinafter referred to as shift processing or normalization processing).

At this time, a shifted bit number is a generated code length, and information shifted out from the C register is a code. Specific examples are shown in FIGS. 1A to 1F.

FIGS. 1A to 1F show values of the arithmetic register before and after shift processing. Assume that the lengths of the A register and C register are N+1 bits, respectively, and the values of the respective registers immediately after arithmetic coding (before shift processing) are those shown in FIG. 1A. In this case, it is determined that the value falls within a predetermined range because the most significant bit of the A register is '1', and thus shift processing is not performed (FIG 1B), and the generated code length is 0 bit.

Then, assume that the values of the respective registers immediately after arithmetic coding are those shown in FIG. 1C. In this case, it is determined that the value does not fall within a predetermined range because the most significant bit of the A register is '0', and thus shift processing is performed. For this shift processing, left shifting is carried out until the most significant bit of the A register becomes '1'. In the example shown in FIG 1C, 5-bit left shifting is performed. This 5-bit shifting is also performed for the C register. Thus, a 5-bit code of "10100" is shifted out from the C register, and this code is outputted as a code. When such 5-bit shifting is performed, '0' is added to the lower five bits of the respective registers. As a result, the values of the respective registers after shift processing are those as shown in FIG. 1D.

Then, assume that the values of the respective registers immediately after arithmetic coding are those in FIG. 1E. In this case, the value of the A register is the minimum, and the generated code is a N-bit code (upper N bits of the C register). If the value of the A register is smaller than this value, the value equals to '0', and there is no possibility that the most significant bit is '1' with any bit shifting, leading to a breakdown of shift processing. The values of respective registers after shift processing in FIG. 1E are those as shown in FIG. 1F.

In the above description, relationship between the values of registers for use in arithmetic computation and the codes and code lengths generated for the values has been shown.

If information generated in the computation unit is only a variable length code and code length information, the process is simple. If the variable length codes are concatenated seamlessly, and are then cut by a predetermined length, a code of fixed length can be outputted.

A Huffman encoder that is one type of encoders for entropy coding outputs only a variable code and code length information, and thus a code of fixed length can be obtained only with the aforesaid processing. What performs such processing is generally called a (length fixation) packing circuit, and has been used for many years as with the Huffman code. One example of the packing circuit is shown in FIG. 2 for reference.

FIG. 2 shows the configuration of a general packing circuit for length fixation. The packing circuit shown in FIG. 2 accepts variable length codes of 0 to 15 bits, couple the codes and output them in 16 bits.

In FIG. 2, reference numeral 201 denotes a terminal for inputting variable length codes of 0 to 15 bits, reference numeral 202 denotes a terminal for inputting code length information of 4 bits, reference numeral 203 denotes an adder for adding inputted code length information to the bit number of codes remaining in the packing circuit, reference numeral 204 denotes a carry output of the adder 203, reference numeral 205 denotes lower a 4-bit output of the adder 203, reference numeral 206 denotes a D flip-flop for latching the carry output 204, reference numeral 207 denotes a 4-bit D flip-flop for latching the lower 4-bit output 205 of the adder 203, reference numeral 208 denotes an output signal of the D flip-flop 206, reference numeral 210 denotes a barrel shifter for shifting an input variable length code, reference numeral 211 denotes a coupler for concatenating the code remaining in the packing circuit to the input variable length code, reference numeral 212 denotes a 30-bit D flip-flop for latching the codes concatenated by the coupler 211, and reference numeral 213 denotes a shifter for shifting by 16 bits the concatenated code outputted from the D flip-flop 212.

Operations of the packing circuit shown in FIG. 2 will be briefly described below.

First, a hold value of the D flip-flop 207 is cleared to zero by initialization processing. Then, a first variable length code is inputted from the terminal 201, and is sent straightly to the coupler 211 without being shifted by the barrel shifter 210, and the input variable length code is at the head of the concatenated code. If the code length of this variable length code is S bits, code length information of the value S is inputted to the terminal 202 at the inputting of the variable length code. The code length information is latched in the D flip-flop 207 via the adder 203. Thereby, the first variable length code of S bits is captured in the packing circuit.

Then, assume that a variable length code of T bits is inputted. The variable length code inputted from the terminal 201 is shifted by S bits by the barrel shifter 210, and is sent to the coupler 211. The coupler 211 couples the T-bit variable length code shifted by S bits to the rear of the first inputted S-bit variable length code, and newly generates a concatenated code of (S+T) bits. The concatenated code is latched in the D flip-flop 212. On the other hand, the value T being code information is inputted in the terminal 202, and S+T is computed by the adder 203. If S+T<16 holds, then the concatenated code is retained, and a variable length code to be inputted next is further concatenated.

If S+T≧16 holds, then the concatenated code has a length of 16 bits or larger, and thus leading 16 bits are outputted to the outside by a signal line 215. In this case, the carry signal 204 is generated during computation of S+T in the adder 203, '1' is captured in the D flip-flop 206, and the signal 208 also takes on '1'. The signal 208 is a signal indicating that a 16-bit code is outputted to the outside, and the 16-bit code of the signal line 215 is a valid output when the signal takes on '1'. The carry is generated, whereby the value of lower 4 bits of the adder 203 becomes S+T−16, and the result of the addition is retained in the D flip-flop 207.

Thereafter, processing same as the above processing is repeated to couple variable length codes one after another and outputs the same as 16-bit codes. If the output of the arithmetic encoder constituted only by the variable length code and information of the code length, this simple packing circuit can satisfy the needs.

Furthermore, in FIG. 2, the lengths of variable length codes that can be inputted are 0 to 15 to show the simplest packing circuit, but the lengths of variable length codes that can be inputted may be 0 to 16 by slightly modifying the adder 203.

If the length of the fixed length code to be outputted is 16, the variable length code that can be inputted may be 16 at the maximum if the worst condition (the case where the longest code is consecutively inputted) is taken into consideration. This is because assume that the maximum code length of input is 17 bits, and when the 17-bit code is consecutively inputted, the length of codes remaining in the packing circuit is increased by one bit with one time input/output, and thus the number of bits that can be retained in the internal register is exceeded.

A carry signal that is another output of the arithmetic unit will now be described.

In arithmetic coding, information of whether a symbol that is encoded is consistent with a predicted value and a probability estimation value of likelihood that the predicted value does not appear are used. The former information is used for selection of computation, and the latter probability estimation value is used for actual computation.

For the A register, generally, any one of the value obtained by subtracting the probability estimation value from the A register and the probability estimation value is selected based on the aforesaid consistency/inconsistency information, and is used as a new value of the A register. Regardless of which value is selected, the value of the A register is smaller than the previous value, and shift processing is not performed if the value falls within a predetermined range, but left shifting is performed until the value falls with in the predetermined range if it falls below the predetermined range.

For the C register, there are a variety of computation methods such as computation suitable for software processing, computation for hard ware processing, subtraction computation and addition computation, even if only the JBIG system is considered. In this case, whether the type of computation for the C register is addition or subtraction computation is a matter.

If the computation is addition computation, whether nothing is added or some value is added to the C register is selected based on the aforesaid consistency/inconsistency information. In this case, addition computation may generate a carry signal. This is because there is a possibility that the value of the C register before computation is already sufficiently large, and some value is added thereto, whereby an overflow occurs in the register. If the overflow occurs, the carry signal is outputted to the outside, and remaining values are made to be new values of the C register (values before shift processing), thereby making it possible to move to a next process without breakdown.

If the computation is subtraction computation, whether nothing is subtracted or some value is subtracted from the C register is selected based on the aforesaid consistency/inconsistency information. In this case, subtraction computation may generate a borrow signal. This is because there is a possibility that the value of the C register before computation is already sufficiently small, and some value is subtracted therefrom, whereby an overflow occurs negatively in the register. If the overflow occurs, the borrow signal is outputted to the outside, and remaining values are made to be new values of the C register (values before shift processing), thereby making it possible to move to a next process without breakdown.

A new circuit is required for processing such a carry signal.

A method in which an addition circuit for adding the carry signal to a general packing circuit as shown in FIG. 2 is added to process the carry signal has been proposed (Japanese Patent Publication No. 7-123228). In this method, however, a new carry occurs due to the added addition circuit, and after all, a carry signal appears again in the output subjected to packing processing.

Explanation will be given using FIG. 3 showing only input/output relationship of the packing circuit for making it easier to understand. FIG. 3 shows an input/output signal of the packing circuit with input/output of carry signals. The following can be easily understood, compared to FIG. 2.

The packing circuit has input/output signals same as those of a conventional packing circuit.

Input of the carry signal occurs, and associated therewith, output of the carry signal occurs.

FIG. 4 shows a packing circuit with input/output of carry signals and the input/output signal of a circuit processing the output of the packing circuit. A new circuit 401 as shown in FIG. 4 is required separately for processing a new carry signal generated in the packing circuit with input/output of carry signals, and the circuit is inserted in a next layer, and finally only a 16-bit output signal with no carry signal and a signal indicating presence/absence of output remain. This processing method leads to such the configuration because carry processing is left over.

As described above, according to the above described prior arts, when a variable length code supplied together with a carry signal is converted into a defined fixed length code with no carry signal, good compatibility with other entropy coding to generate only the variable length code (meaning no carry signal) is obtained, and thus another (length fixation) packing circuit is required for converting the variable length code generated from the entropy encoder into a fixed length code.

SUMMARY OF THE INVENTION

The present invention has been made in view of the above described problems, and its object is to provide a data converting method and apparatus enabling a variable length code with a carry signal to be converted into a variable length code with no carry signal.

According to the present invention, the foregoing object is attained by providing a data processing apparatus, comprising: concatenation means for incorporating inputted carry signals in a retained remaining code, and concatenating thereto an inputted variable length code to generate a concatenated code; outputting means for separating from the concatenated code a defined code portion that is not influenced by the carry signal and outputting the same; retaining means for retaining an undefined code portion obtained by removing the defined code portion from the concatenated code, as a remaining code for use in the concatenation means; first acquisition means for acquiring the code length of the undefined code when the whole of the concatenated code is an undefined code; and generating means for generating a predetermined defined code having a code length obtained with the first acquisition means and outputting the same.

The present invention further provides a data processing apparatus, comprising: concatenation means for incorporating inputted carry signals in a retained remaining code, and concatenating thereto an inputted variable length code to generate a concatenated code; first outputting means for separating from the concatenated code a defined code portion that is not influenced by the carry signal, and outputting the defined code portion and the code length thereof; retaining means for retaining an undefined code portion obtained by removing the defined code portion from the concatenated code, as a remaining code for use in the incorporating means; first acquisition means for acquiring the code length of the defined code if the whole of the concatenated code is an undefined code; and second outputting means for outputting the code length obtained by the first acquisition means.

The present invention further provides a data processing method, comprising: a concatenating step of incorporating inputted carry signals in a retained remaining code, and concatenating thereto an inputted variable length code to generate a concatenated code; an outputting step of separating from the concatenated code a defined code portion that is not influenced by the carry signal and outputting the same; a retaining step of retaining an undefined code portion obtained by removing the defined code portion from the concatenated code, as a remaining code for use in the concatenating step; a first acquiring step of acquiring the code length of the undefined code when the whole of the concatenated code is an undefined code; and a generating step of generating a predetermined defined code having a code length obtained by the first acquiring step and outputting the same.

The present invention further provides a data processing method, comprising: a concatenating step of incorporating inputted carry signals in a retained remaining code, and concatenating thereto an inputted variable length code to generate a concatenated code; a first outputting step of separating from the concatenated code a defined code portion that is not influenced by the carry signal, and outputting the defined code portion and the code length thereof; a retaining step of retaining an undefined code portion obtained by removing the defined code portion from the concatenated code, as a remaining code for use in the incorporating step; a first acquiring step of acquiring the code length of the defined code if the whole of the concatenated code is an undefined code; and a second outputting step of outputting the code length obtained in the first acquiring step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A to 1F show values of an arithmetic register before and after shift processing;

FIG. 22 is a block diagram showing a configuration of the defined/undefined code separator according to a thirteenth embodiment;

FIG. 27 is a block diagram showing a configuration of the defined/undefined code separator according to an eighteenth embodiment.

DETAILED DESCRIPTION OF THE PREFERRED EMBODIMENTS

Preferred embodiments of the present invention will now be described in detail in accordance with the accompanying drawings.

[First Embodiment]

In the first embodiment, a code converter processing a variable length code with carry signals obtained by encoding a signal through arithmetic coding and the like to convert the variable length code into a variable length code with no carry signal will be described.

Figure 5:
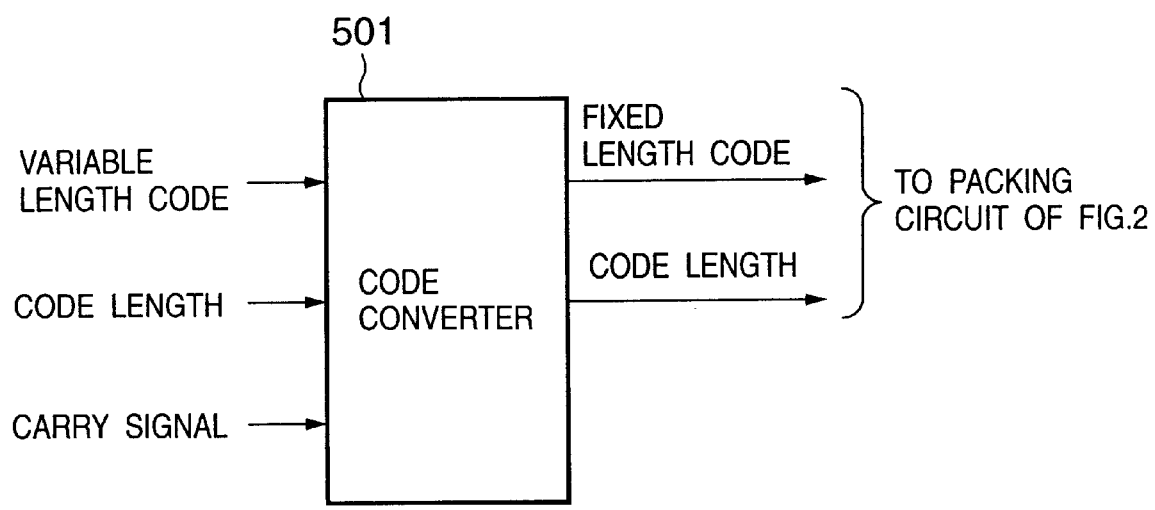
FIG. 5 shows input/output signals of a code converter according to the first embodiment.

FIG. 5 shows input/output signals of the code converter according to the first embodiment. The function of the code converter 501 is to process variable length codes supplied together with carry signals to convert the same into codes capable of being processed by a general packing circuit shown in FIG. 2. In other words, variable length codes supplied together with carry signals are converted into defined variable length codes with no carry signals.

In this case, the case is considered where the carry signal is not a borrow signal but a carry signal. First, see the following 13-bit code.

"1110011011011"

If the carrying carry signal (it is added at the least significant position of the above described 13-bit code) is '0', the above described 13-bit code does not change at all and retains the same value as ever.

On the other hand, if the carrying carry signal is '1', the above described 13-bit code changes to "1110011011100".

It will be understood by comparing the above described two 13-bit codes is that the code of leading 10 bits is defined without changing with the value of the carrying carry signal. On the other hand, the code of last three bits changes with the value of the carrying carry signal. For making a clear distinction between the code of leading 10 bits and the code of last three bits, the former is called defined bits or a defined code, and the latter is called undefined bits or an undefined code. In this connection, in the case of variable length codes with no carry signals, it is not necessary to make a distinction between defined and undefined codes because all the bits are defined bits from the first to the last.

Any variable length code with carry signals can be divided into the above described defined code and undefined code. For methods of dividing the variable length code into the defined code and undefined code, the following methods can be considered, for example.

(a) A bit group that does not change when 1 is added to the least significant bit is a defined code, and a bit group that changes when 1 is added is an undefined code.

(b) '0' is searched for from the least significant bit towards the most significant bit, and it is determined that the code constituted by bits in the range of from the first found bit of '0' to the least significant bit is an undefined code, and the code constituted by bits thereabove is a defined bit.

For the above described method of (a), an adder, an identity detection circuit and the like are needed, and for the method of (b), a '0' detection circuit, a decoder, an encoder and the like are needed. In any case, any variable length code can be divided into the above described defined code and undefined code.

Furthermore, if the input of '1' continues from the beginning, all the consecutive '1s' constitute a defined code. This is because no carry occurs in this case. This can be understood from the principle of the arithmetic code, and if a carry occurred, all rows of '1s' would have been changed to '0s' to cause propagation of the carry before the head of the code, leading to breakdown. Conversely speaking, it is demonstrated from the principle of the arithmetic code that such breakdown cannot occur.

The code converter 501 according to this embodiment outputs a defined variable length code with no carry signals, and thus a defined code can be outputted if a concatenated code can be divided into a defined code and an undefined code through the above described method. When the defined code is outputted in this way, only the undefined code remains. Then, a next variable length code with carry signals is received, input carry signals are added to the above described undefined code, the input variable length code is concatenated to the rear thereof, and a new concatenated code is generated. The concatenated code generated in this way is divided again into the defined code and the undefined code, and only the defined code is outputted.

Generally, the code signal has high randomicity because the redundancy of original data encoded is removed, and it can be considered that eventual probabilities of '0' and '1' take on values close to 0.5, respectively. Therefore, there is a high possibility that the bit '0' is included in a newly inputted variable length code, and therefore there is a high possibility that a new defined code is generated by concatenating the new variable length code (the code before the bit '0' is a new defined code).

In this way, there may be the case where undefined codes come in succession in large quantity although with low probability, if output of defined codes, addition of input carry signals, and concatenating of input variable length codes are repeatedly carried out. It is impractical to retain such a large quantity of undefined codes in the concatenating unit, and it is desired that they are converted into a different form of information and are retained. Such an undefined code is code information with the value changed depending on whether the input carry signal is '1' or '0', and thus for its contents, the first bit is '0' and the second bit and the all the bits thereafter are '1' as shown below.

<Contents of Undefined Code: 011111 . . . 1111>

That is, it can be understood that the undefined code can be reconstructed from the code length of the undefined code because the undefined code is constituted by '0' of one bit and '1' of Lc-1 bits when the length of the undefined code is Lc. Therefore, the undefined code may be converted into a form of information of code length before being retained. Thereby it can be said that a code length counter of 10-bit length may be possessed instead of a cord register of a thousand bit length.

Figure 2:
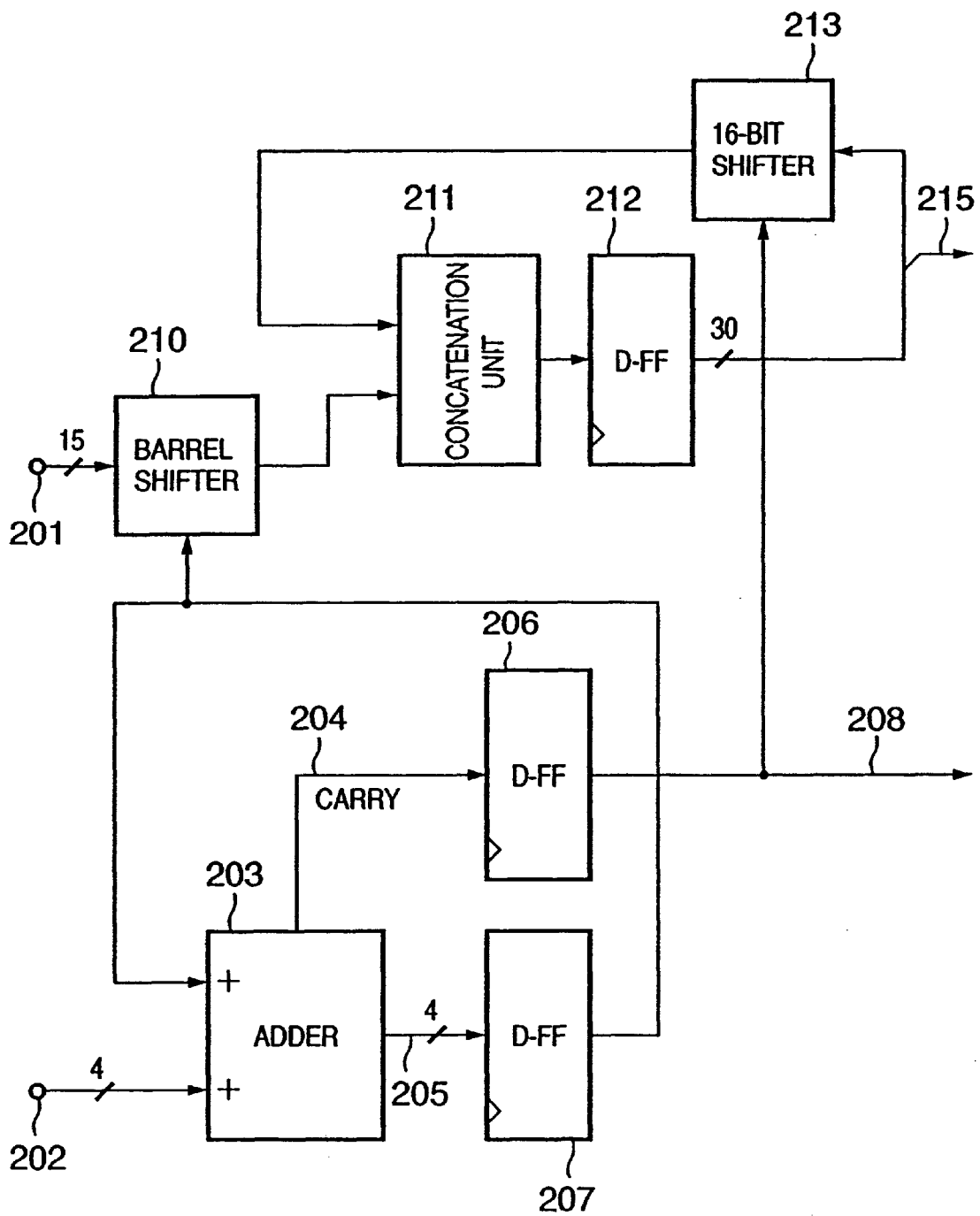
FIG. 2 shows a configuration of a general packing circuit for length fixation.
Figure 3:
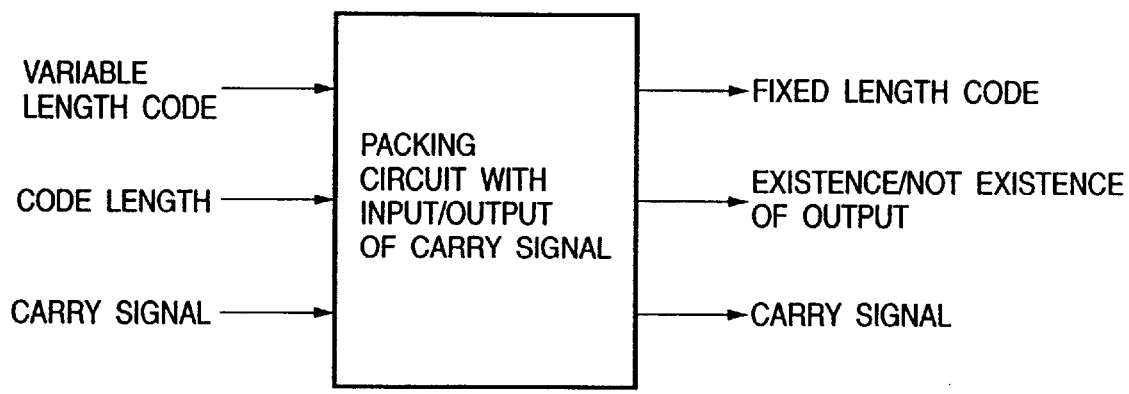
FIG. 3 shows input/output signals of the packing circuit with input/output of carry signals.
Figure 4:
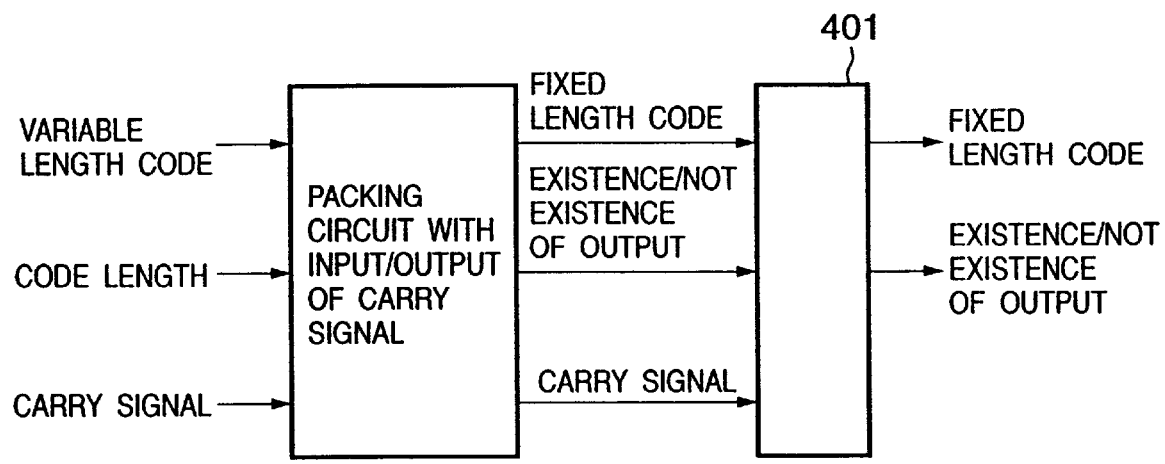
FIG. 4 shows input/output signals of the packing circuit with input/output of carry signals and a circuit for processing the output of the packing circuit.

To summarize description presented hitherto, the code converter 501 couples inputted variable length codes with carry signals, divides the codes into a defined code and an undefined code, outputs the defined code to the packing circuit shown in FIG. 2, and retains the length of the undefined code in the code length counter.

The information retained in the code length counter is defined if the inputted carry signal is '1' or '0' exists in the inputted variable length code, and is then outputted as a defined code to the packing circuit shown in FIG. 2. Then, the value of the code length counter is cleared to zero.

At this time, in the case where the above described undefined code is outputted as a defined code when the inputted carry signal is '1', the above described undefined code is reversed before it is outputted. Specifically, for the code that is outputted, the first bit is '1' and the second bit and all the bits thereafter are '0'. Also, in the case where the above described undefined code is outputted as a defined code when the inputted carry signal is '0' and '0' exists in the variable length code, the undefined code is directly outputted without being reversed.

Figure 6:
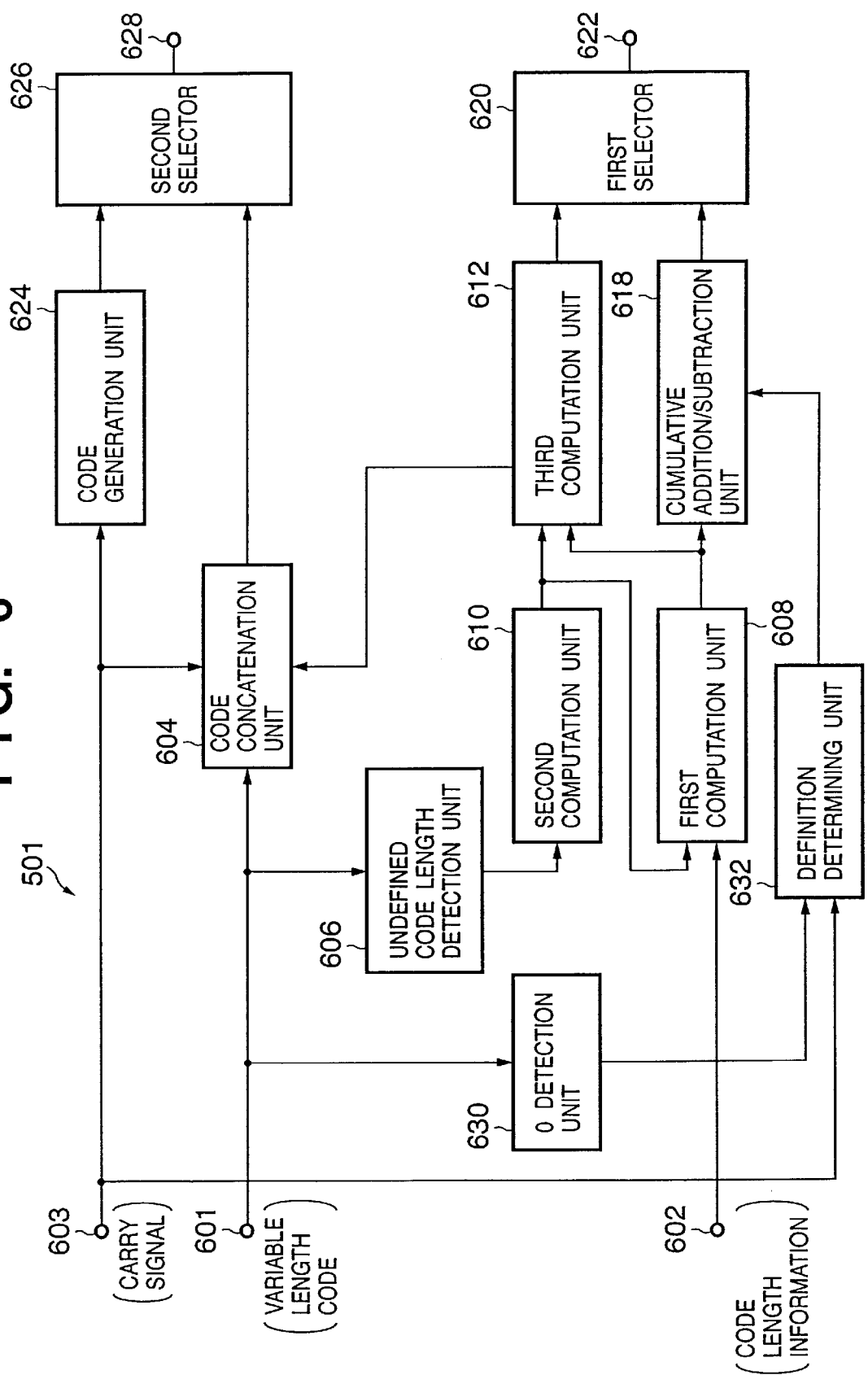
FIG. 6 is a block diagram showing a configuration of the code converter according to a first embodiment.

The basic contents of process of the cord converter 501 according to this embodiment have been described above. The configuration and operation of a cord converter 600 will be described in detail below, referring to FIG. 6. FIG. 6 is a block diagram showing the configuration of the cord converter according to the first embodiment.

In FIG. 6, reference numeral 601 denotes a terminal for inputting variable length codes, reference numeral 602 denotes a terminal for inputting code length information, reference numeral 603 denotes a terminal for inputting carry signals, reference numeral 604 denotes a code concatenating unit concatenating an input variable length code to remaining codes, reference numeral 606 denotes an undefined code length detection unit detecting the bit number of the undefined code in the input variable length code, reference numeral 608 denotes a first computation unit counting the total bit number of the concatenated code, reference numeral 610 denotes a second computation unit computing the bit number of the undefined code in the concatenated code, reference numeral 612 denotes a third computation unit computing the bit number of the defined code in the concatenated code, reference numeral 618 denotes a cumulative addition/subtraction unit accumulating values counted by the first computation unit 608 under predetermined conditions, reference numeral 620 denotes a first selector selecting any one of the bit number of the defined code determined by the third computation unit 612 and the output value from the cumulative addition/subtraction unit 618, reference numeral 622 denotes a terminal for outputting the value selected by the first selector, reference numeral 624 denotes a code generation unit generating a code in which the first bit is in reverse of the second bit and all the bits thereafter (namely, a bit string of "10000 . . ." or a bit string of "01111 . . ."), reference numeral 626 denotes a second selector selecting any one of the concatenated code outputted from the code concatenating unit 604 and the code outputted from the code generation unit 624, reference numeral 628 denotes a terminal for outputting the code selected by the second selector (only a portion of the output code corresponding to the number of bits outputted from the terminal 622 represents an valid output), reference numeral 630 denotes a 0 detection unit detecting whether or not '0' exists in the variable length code, and reference numeral 632 denotes a definition determining unit determining that the undefined code has been defined, from the output signal of the above described 0 detection unit and the input carry signal.

Operations of the cord converter 501 of this embodiment will be described below, but the steady state will be described because if the initial state is described first, the most part of description of the steady state is covered thereby.

In the steady state, the defined code and undefined code exist in the code concatenating unit 604, the code length information of the undefined code is retained and outputted as the computation result of the second computation unit 610. Also, the code information of the whole of the defined and undefined codes is retained and outputted as the computation result of the first computation unit 608. Therefore, if the output of the second computation unit 610 is subtracted from the output of the first computation unit 608 in the third computation unit 612, the code length of the defined code can be obtained. Since a defined code to be outputted exists in the terminal 628 unless the code length of the defined code is zero, the subtraction result (defined code length) is selected by the first selector 620 and a code outputted from the code concatenating unit 604 is selected by the second selector 626, and the selected subtraction result and code are outputted from the terminals 622 and 628, respectively. Since the outputted defined code is not needed in the next operation cycle, the code in the code concatenating unit 604 is shifted by the output value of the third computation unit 612 to remove the defined code.

At the time of outputting the above described defined code, carry signals inputted from the terminal 603 are sent to the code concatenating unit 604, the code generation unit 624, the definition determining unit 632 and the like. In the code concatenating unit 604, the carry signal is added to the code (undefined code portion) remaining in this code concatenating unit 604. If the carry signal is '1', the undefined code portion becomes a defined code with each bit information reversed through addition processing. On the other hand, if the carry signal is '0', the undefined code is still an undefined code with nothing changed through addition processing. Then, the variable length code inputted from the terminal 601 is concatenated to the code remaining there in the code concatenating unit 604.

An example of operation will now be described, showing specific codes. First, assume that a 13-bit code of "0011100011111" exists in the code concatenating unit 604. In this case, the leading 7 bits are defined bits and the last 6 bits are undefined bits, and the value of "13" is outputted from the first computation unit 608 and the value of "6" is outputted from the second computation unit 610. Then, 13-6 is computed in the third computation unit 612, and it can thus be understood that the defined code has 7 bits.

This subtraction result "7" is outputted to the terminal 622 via the first selector 620, the code "0011100011111" existing in the code concatenating unit 604 is outputted to the terminal 628 via the second selector 626. The valid output includes the first 7 bits in this output code, namely "0011100". In the code concatenating unit 604, the outputted defined code of 7 bits is shifted and removed so that the undefined code "011111" remains in the next operation cycle. Furthermore, the output of the result of computation by the third computation unit 612 is supplied to the code concatenating unit 604, and the defined code is shifted (removed) based on this value.

On the other hand, the carry signal is inputted from the terminal 601, and if this value is '1', this carry signal is added to the undefined code "011111" in the code concatenating unit 604 to change to a defined code of "100000", and the remaining undefined code is cleared to zero at the same time. If the carry signal from the terminal 601 is '0', the above described undefined code "011111" retains the same value.

Here, description of operations will be continued assuming that the carry signal is '0'.

If the carry signal is '0' and then a 6-bit variable length code of "011011" is inputted from the terminal 601, this code is concatenated to the remaining undefined code "011111" in the code concatenating unit 604, and becomes a new concatenated code of 12 bits of "011111011011" in the next cycle.

The above described input variable length code of 6 bits is also sent to the 0 detection unit 630 and the undefined code length detection unit 606. The 0 detection unit 630 detects whether or not '0' exists in the inputted variable length code, and sends the result of the detection to the definition determining unit 632. The undefined code length detection unit 606 detects an undefined code length in the inputted variable length code, and sends the detected value to the second computation unit 610. At the same time, the code length information inputted from the terminal 602 is sent to the first computation unit 608.

In the case where the above described variable length code "011011" is inputted, an undefined code length of 3 bits is detected, and this value is sent to the second computation unit 610. Also, the value '6' is sent as code length information to the first computation unit 608.

The second computation unit 610 outputs the received value '3' as code length information of undefined bits in the next cycle. The first computation unit 608 outputs a value (6+6=12) obtained by adding input code length information to the output value of the second computation unit 610, as a concatenated code length in the next cycle. Therefore, the defined code length in the next cycle equals to 9 bits, which are obtained by subtracting the output of the second computation unit 610 from the output of the first computation unit 608. This is computed by the third computation unit 612 as a matter of course.

The case where the carry signal is '1' will now be considered. In this case, as described above, the carry signal is added to the undefined code "011111" to change to a defined code of "100000" in the code concatenating unit 604. At this time, when a 6-bit variable length code of "011011" is inputted from the terminal 601, the code is concatenated to the above described defined code "100000", and it becomes a new concatenated code of 12 bits of "100000011011" in the next cycle.

Although the contents of the concatenated code are different from those of the aforesaid case, the code length of the defined code in the concatenated code and the whole code length are just same as those of the aforesaid case, and therefore the contents of processes of the first computation unit 608, the second computation unit 610 and the third computation unit 612 are similar to those of the aforesaid case.

The case where a 6-bit variable length code of "111111" is inputted while the carrying is kept at '0' will now be considered. In this case, in the next cycle, a new concatenated code of 12 bits of "011111111111" is generated in the code concatenating unit 604.

In this case, however, the undefined code length detected by the undefined code length detection unit 606 is zero (See the aforesaid method (b) of division into the defined code and the undefined code). This does not mean that the actual undefined code is zero. If the whole of the inputted code is constituted by '1s', whether the code is a defined code or an undefined code cannot be determined by itself, but is determined depending on whether the immediately preceding bit is a defined bit or an undefined bit.

That is, if in the 0 detection unit 630, '0' cannot be detected in the input variable length code, it is determined that the whole of the inputted variable length code is constituted by '1s', and the variable length code is entirely a defined code or an undefined code. Thus, it can be understood that the computation process in the second computation unit depends on the output of the 0 detection unit 630 and the sate of the last bit in the code concatenating unit 604 (the flow of signals engaged in these controls is omitted because it may too much complicate FIG. 6).

In this case, the 6-bit input code is entirely an undefined code, in the second computation unit 610, the above described undefined code length is added to the undefined code length (6) in the current cycle, whereby the undefined code length in the next cycle is 6+6=12. In the first computation unit 608, as described previously, the value (6+6= 12) obtained by adding input code length information to the output value of the second computation unit 610 is outputted as a concatenated code length in the next cycle.

In the next cycle, because the output of the first computation unit 608=the output of the second computation unit 610 holds, the output of the third computation unit 612 computing a defined code length is zero, and thus there exists no defined code that can be outputted. Nevertheless, the first selector 620 selects the output of the third computation unit 612, and outputs the same to the terminal 622. Thereby, it is shown to the outside that there exists no defined code to be outputted.

If there exists no defined code to be outputted, no accompanying process occurs, and thus a different process can be carried out instead thereof. That is, all the undefined bits in the code concatenating unit 604 can easily be transferred to the cumulative addition/subtraction unit 618. It can easily be done because all process that is actually carried out is just transferring concatenated code length information retained in the first computation unit 608 to the cumulative addition/subtraction unit 618. In the case of the undefined code, it is not necessary to retain the contents of the code themselves, as described above. After the transfer is performed, the code length in the code concatenating unit 604 becomes zero, and the values of the first computation unit 608 and second computation unit 610 are also cleared to zero.

The cumulative addition/subtraction unit 618 retains zero as an initial value, and the undefined code length information transferred from the first computation unit 608 is added to the retained value to form a new retained value (the new retained value in this case equals to 12).

As long as the bits of variable length codes to be inputted subsequently are all '1', those codes are all undefined codes, and code length information to be inputted is transferred to the cumulative addition/subtraction unit 618 via the first computation unit 608 and is added cumulatively one after another.

The undefined code (bit number thereof) added cumulatively to the cumulative addition/subtraction unit 618 is changed to a defined code in any of the following two cases.

(1) when '1' is inputted in the carry signal.
(2) when the bit '0' is detected in the input variable length code.

Detection for the above (2) is performed in the 0 detection unit 630, and it is detected in the definition determining unit 632 that any of the above (1) and (2) has occurred.

If the code is defined due to the above (1), the defined code is the reverse of the undefined code. Namely, it is a code in which the first bit is '1' and the second bit and all the bits thereafter are '0'. On the other hand, if the code is defined due to the above (2), the defined code is identical to the undefined code. Also, if the cases of both (1) and (2) occur at a time, higher priority is given to the above (1) in terms of the contents of the defined code. That is, process is carried out under the assumption that the undefined code is changed to defined code due to (1) and thereafter the case of (2) occurs. By so doing, consistency of the entire process is maintained. In this way, since the defined code depends on the carry signal when the undefined code is defined, the code generation unit 624 generates a defined code with the contents described previously, based on this carry signal. That is, "10000 . . . " is generated when the undefined code becomes a defined code due to (1), and "01111 . . . " is generated if it becomes a defined code due to (2).

In principle, several hundreds or thousands of values may be accumulated in the cumulative addition/subtraction unit 618. The defined code with such a number of bits cannot be outputted at a time, and the maximum code length that can be outputted for each cycle equals to the output bath wide of the terminal 628. Here, explanation will be presented, assuming that the bath wide equals to 16.

Assuming that the value counted by the cumulative addition/subtraction unit 618 is 16×W+R, and the defined bit as such is generated and outputted, the code can be outputted in W cycles if R=0 holds, and the code can be outputted in (W+1) cycles if R≠0 holds. Here, assuming that the input signal based on which the defined code is generated is a and its reverse signal is b, further detailed explanation will be presented.

It can easily be understood that the defined code with 16 may be outputted W times if R=0 holds.

The first defined code is "abbbbbbbbbbbbbbbb", and the following defined codes are "bbbbbbbbbbbbbbbb".

Therefore, the value of 16 is outputted from the cumulative addition/subtraction unit to the terminal 622 via the first selector 620. At this time, in the cumulative addition/subtraction unit 618, control is possible such that outputted values are subtracted from a retained value one after another, and when the retained value becomes zero, the output is stopped. Alternatively, it is possible to set the value of W in a down counter and make one down-count for each output, and stop the output when the value of the counter becomes zero.

If R≠0 holds, there is a problem of whether the incomplete code with R bits is outputted first or outputted last. To describe further in detail, it can also be considered that it is outputted at some midpoint. However, these are not important problems, and thus assume here that the code with R bits is outputted first. So, from the cumulative addition/subtraction unit 618, the value of R is outputted in the first cycle and the value of 16 is outputted in the following cycles.

At this time, for the defined code that is outputted from the code generation unit 624, the first defined code may be "abbbbbbbbbbbbbbbb" and the second defined code may be "bbbbbbbbbbbbbbbb" as in the case of R=0. This is because only the first R bits are considered as a valid code in the defined code that is outputted first.

Since higher priority is given to the output of the above described defined code than to the output of defined bits in the newly inputted variable length code as a matter of course, the output of the defined code is performed continuously and accomplished without being interrupted by output of other codes. The variable length code inputted during output of the defined code is concatenated and retained in the code concatenating unit 604.

[Second Embodiment]

Figure 7:
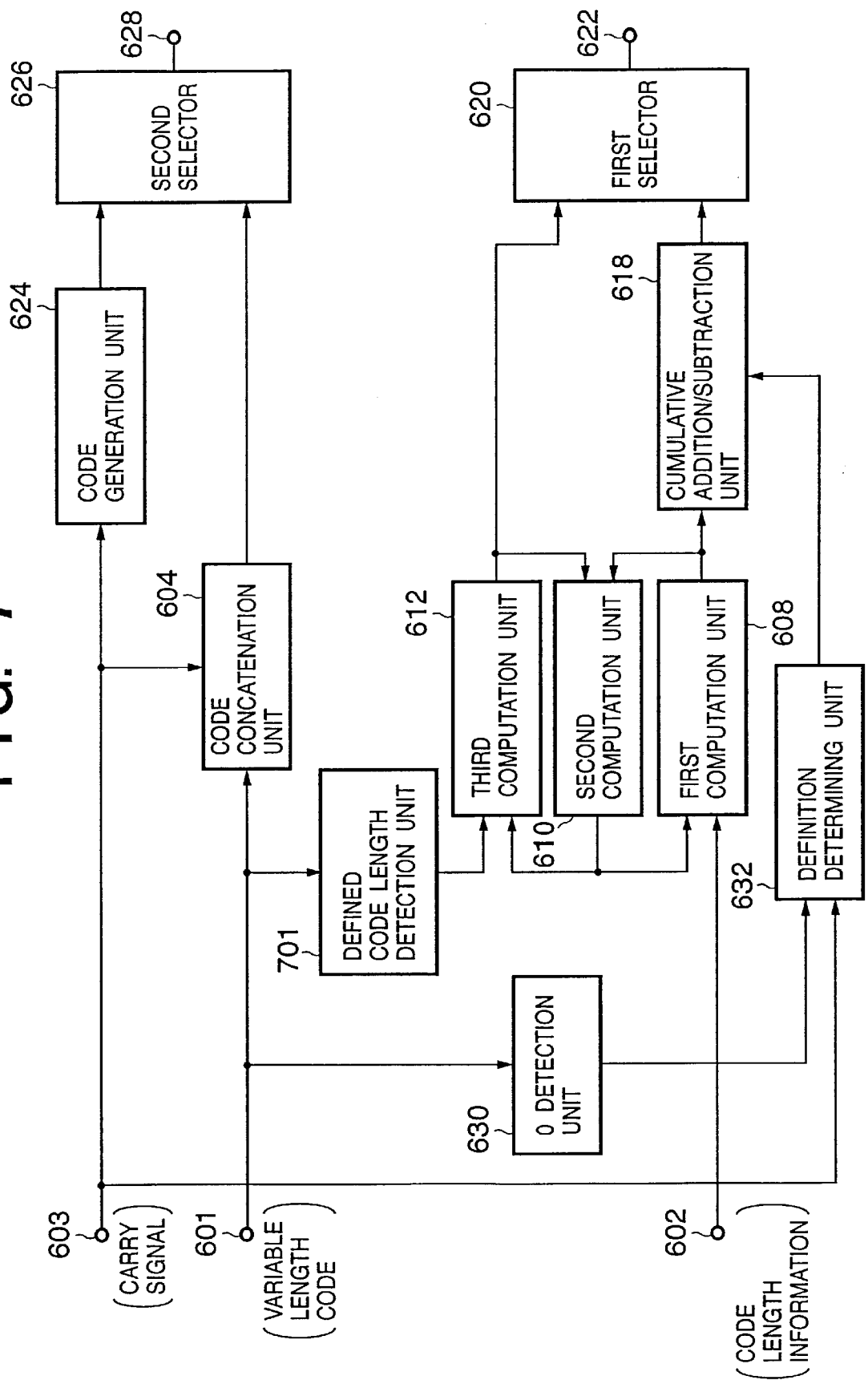
FIG. 7 is a block diagram showing a configuration of the code converter according to a second embodiment.

FIG. 7 is a block diagram showing the configuration of the code converter according to the second embodiment. Reference numeral 701 in FIG. 7 denotes a defined code length detection unit detecting the length of the defined code in the inputted variable length code. Other elements have functions same as those of the elements with identical numbers of the code converter 501 (FIG. 6) in the above described first embodiment.

To describe briefly a difference between the first and second embodiments, they are different form each other in methods of determining the code length of the defined code in the concatenated code. That is, in the second embodiment, a defined code length detection unit 701 is used in stead of the undefined code length detection unit 606. And, the third computation unit 612 computing the number of bits of the defined code in the concatenated code computes the number of bits of the defined code, based on the output of the defined code length detection unit 701 and the output of the second computation unit 610 computing the number of bits of the undefined code in the concatenated code.

As in the case of the first embodiment, in the code converter of the second embodiment, the defined code in the concatenated code is outputted, the undefined code is left, and a newly inputted variable length code is concatenated to the undefined code in each cycle. At this time, if '0' is detected in the newly inputted variable length code, the undefined code left in the code concatenating unit 604 changes to a defined code, and the length obtained by adding thereto the defined code length in the variable length code equals to the length of the defined code in the next concatenated code.

Thus, the basic process in the third computation unit 612 in the second embodiment is to add the output value of the defined code length detection unit 701 to the output value of the second computation unit 610. Furthermore, this process is carried out only if '0' is detected in the inputted variable length code, as described above.

If '0' is not detected in the inputted variable length code, the entire variable length code is either a defined code or an undefined code, and it is dependent on whether the immediately preceding bit is a defined bit or undefined bit. If the immediately preceding bit is a defined bit, the entire variable length code is constituted by defined bits, and code length information inputted from the terminal 602 itself represents the result of computation in the third computation unit 612, while if the immediately preceding is an undefined bit, the variable length code is entirely an undefined code, and the result of computation in the third computation unit 612 is zero.

Also, during output of the code generated in the code generation unit 624, the first to third computation units assume further different computation contents. In this case, since higher priority is given to the output of the code generated in the code generation unit 624, the code in the code concatenating unit 604 is not outputted even if it is a defined code, and it is thus allowed for in the computation contents.

That is, it is a process in which (1) the output value of the defined code length detection unit 701 is added to the output value of the first computation unit 608 if '0' is detected in the inputted variable length code;

(2) code length information to be inputted is added to the output value of the first computation unit 608 if '0' is not detected in the inputted variable length code, and the immediately preceding bit is a defined bit; and (3) the value of the defined code length is not changed, and the previous value is retained as ever if '0' is not detected in the inputted variable length code, and the immediately preceding bit is an undefined bit.

Furthermore, the process in the second computation unit 610 in the second embodiment is to subtract the output value of the third computation 612 (defined code length) from the output value of the first computation unit 608 (concatenated code length).

[Third Embodiment]

Figure 8:
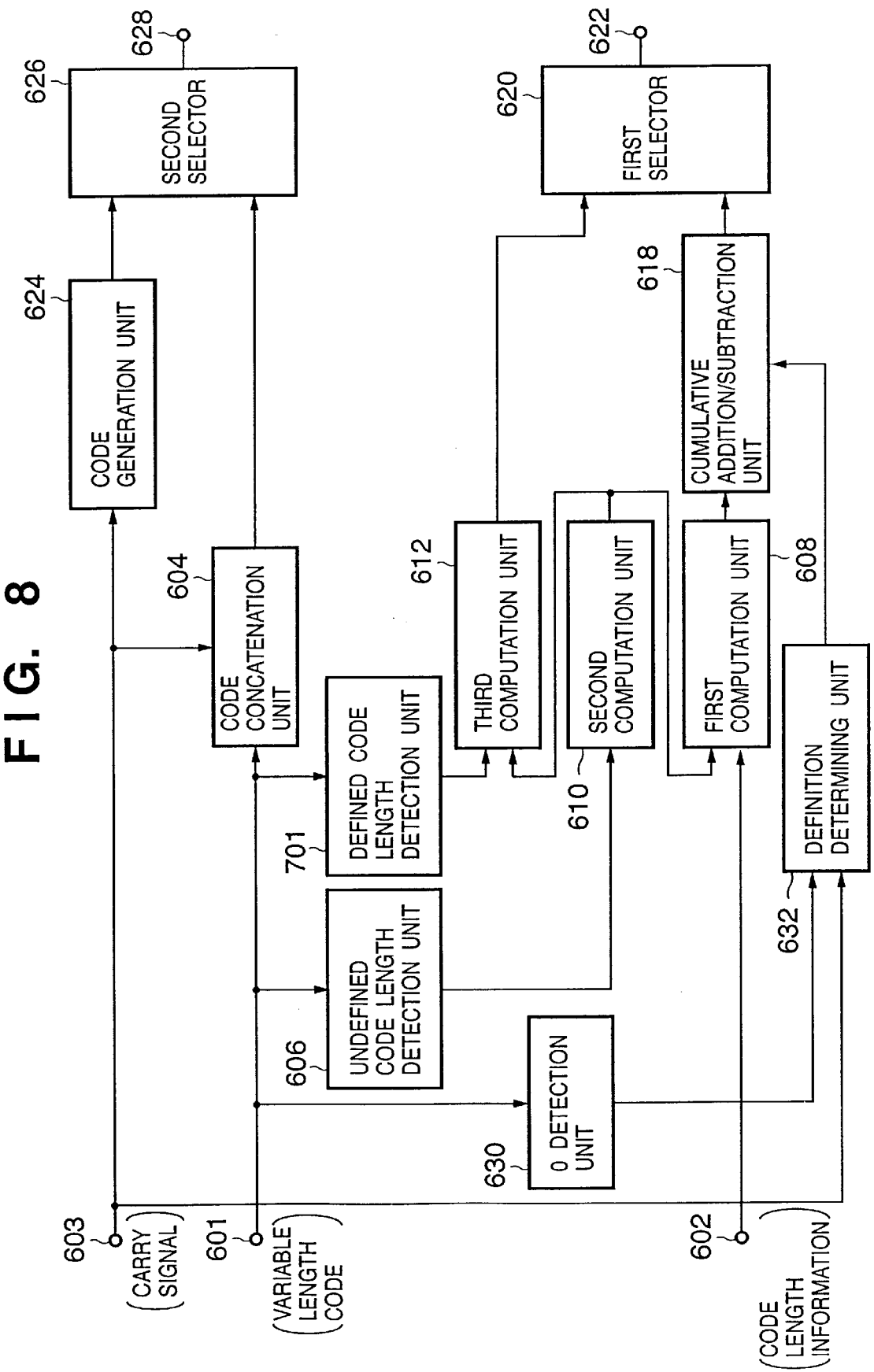
FIG. 8 is a block diagram showing a configuration of the code converter according to a third embodiment.

FIG. 8 is a block diagram showing the configuration of the code converter according to the third embodiment. Each element shown in FIG. 8 has a function same as that of the element with an identical number shown in the above described first embodiment (FIG. 6) or second embodiment (FIG. 7).

To describe briefly a difference between the third embodiment and the above described first and second embodiments, both the undefined code length detection unit 606 and defined code length detection unit 701 are used to determine the code length of the defined code and undefined code length in the concatenated code, in the third embodiment.

The defined code length is determined by subtraction computation of "concatenated code length−undefined code length" in the first embodiment, while the undefined code length is determined by subtraction computation of "concatenated code length−defined code length" in the second embodiment. And, the defined code length is outputted to the outside in the first embodiment, while the undefined code length is used to compute the defined code length in the second embodiment. Therefore, in the above described first and second embodiments, the subtraction process may be critical in operation (in achieving speed-enhanced process of hardware, delay of the signal traveling through a subtracter is so significant that the speed enhancement may be hindered).

Then, in the third embodiment, using both of the undefined code length detection unit 606 used in the first embodiment and the defined code detection unit 701 used in the second embodiment, the undefined code is computed by the method according to the first embodiment, and the defined code is computed by the method according to the second embodiment.

[Fourth Embodiment]

Figure 9:
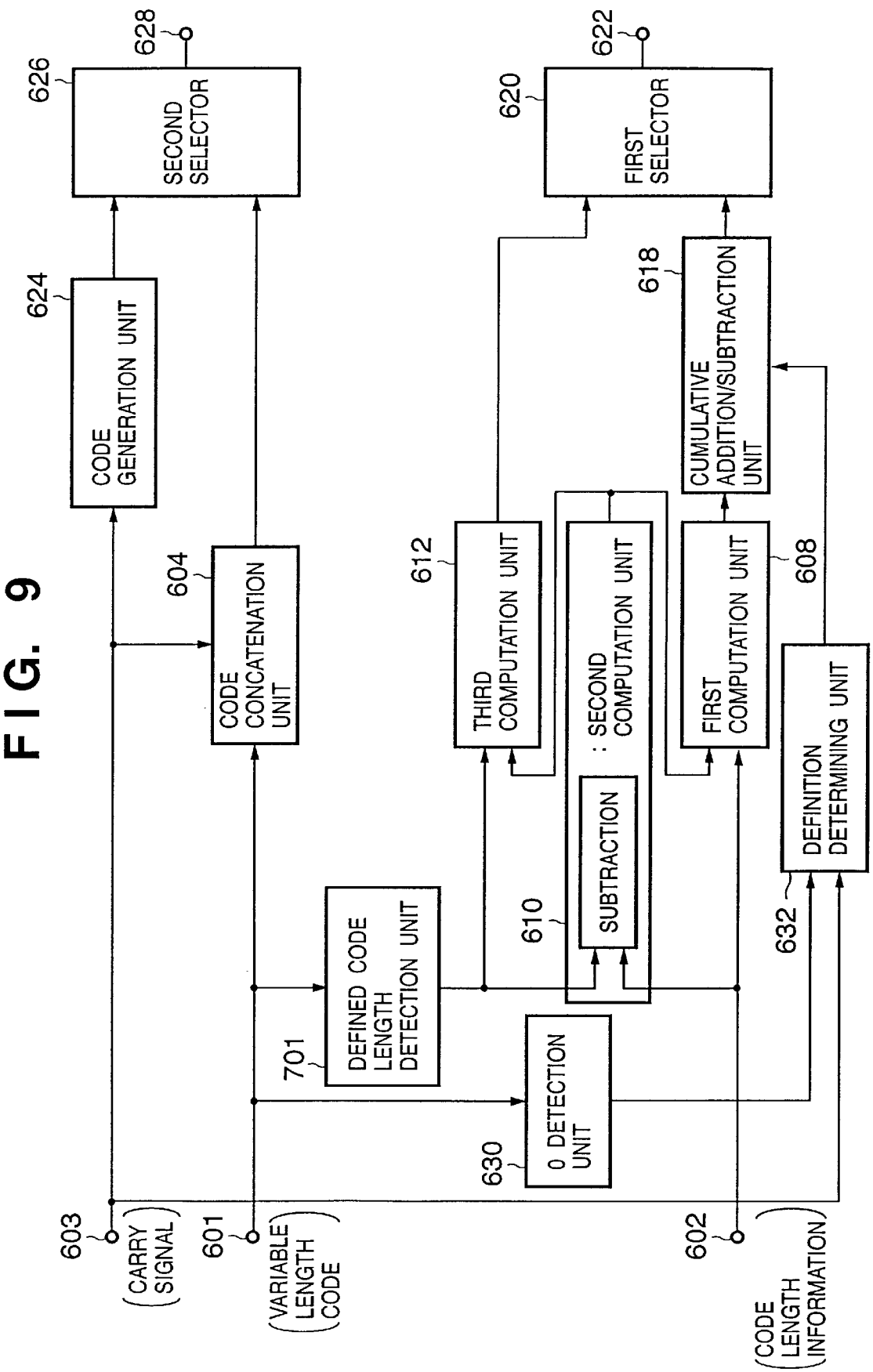
FIG. 9 is a block diagram showing a configuration of the code converter according to a fourth embodiment.

FIG. 9 is a block diagram showing the configuration of the code converter according to the fourth embodiment. Each element shown in FIG. 9 has a function same as that with an identical number shown in the above described second embodiment (FIG. 7).

The fourth embodiment differs from the above described second embodiment in that the undefined code length is determined using a subtraction process of "(code length information inputted from the terminal 602)−(the output value of the defined code length detection unit 701)" instead of using the undefined code length detection unit 606. This subtraction process is a part of process for computing the number of bits of the undefined code in the concatenated code, and thus is included in the second computation unit 610 in terms of configuration.

Therefore, the configuration is similar to that in the block diagram of FIG. 7 representing the second embodiment if comparing elements, but in the second embodiment, only subtraction process of "(the output of the first computation unit)−(the output of the third computation unit)" is carried out in the second computation unit, while in this embodiment, the aforesaid subtraction process is carried out as preprocessing, which is then used to compute the length of the undefined code in the concatenated code.

[Fifth Embodiment]

Figure 10:
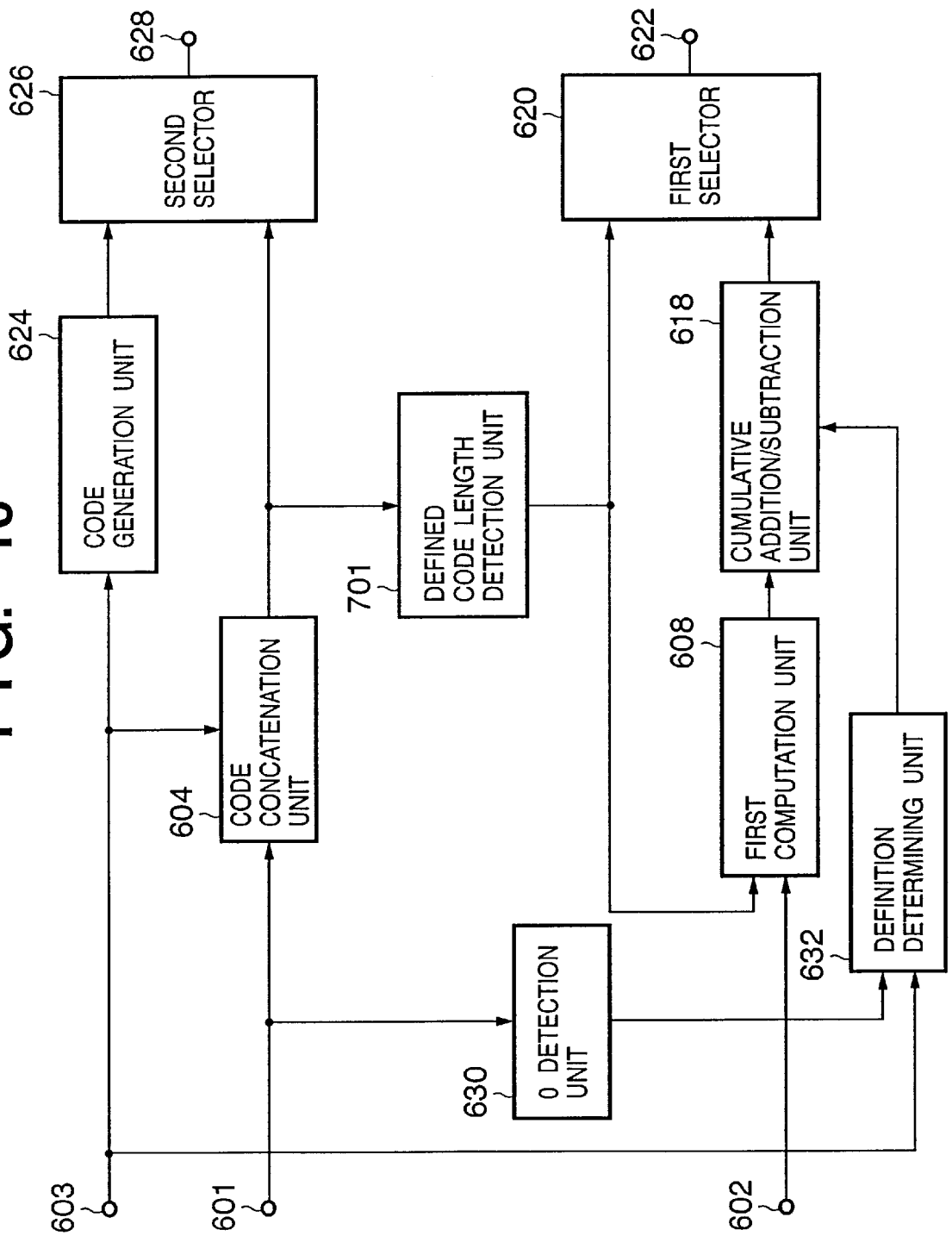
FIG. 10 is a block diagram showing a configuration of the code converter according to a fifth embodiment.

FIG. 10 is a block diagram showing the configuration of the code converter according to the fifth embodiment. In the above described first to fourth embodiments, the defined code length in the concatenated code when the variable length code inputted from the terminal 601 is concatenated is computed and determined concurrently with concatenating processing, based on the contents of the variable length code and code length information inputted from the terminal 602. In contrast, the defined code length is determined from the code after concatenating in the fifth embodiment. Therefore, the defined code length detection unit 701 shown in FIG. 7 is placed at the output side of the code concatenating unit 604.

For example, if the contents of the concatenated code are "0011100011111", the defined code length detection unit 701 recognizes the first 7 bits ("0011100") as a defined code, and outputs the value of 7. This output value is sent to the first selector 620 and the first computation unit 608. The first selector 620 selects this output value and outputs the same to the terminal 622. Thereby, it is shown to the outside that the 7-bit defined code will be outputted. On the other hand, the first computation unit 608 subtracts the inputted defined code length (7) from the code length (13) of the concatenated code, and adds code length information of the variable length code that is inputted next.

Figure 11:
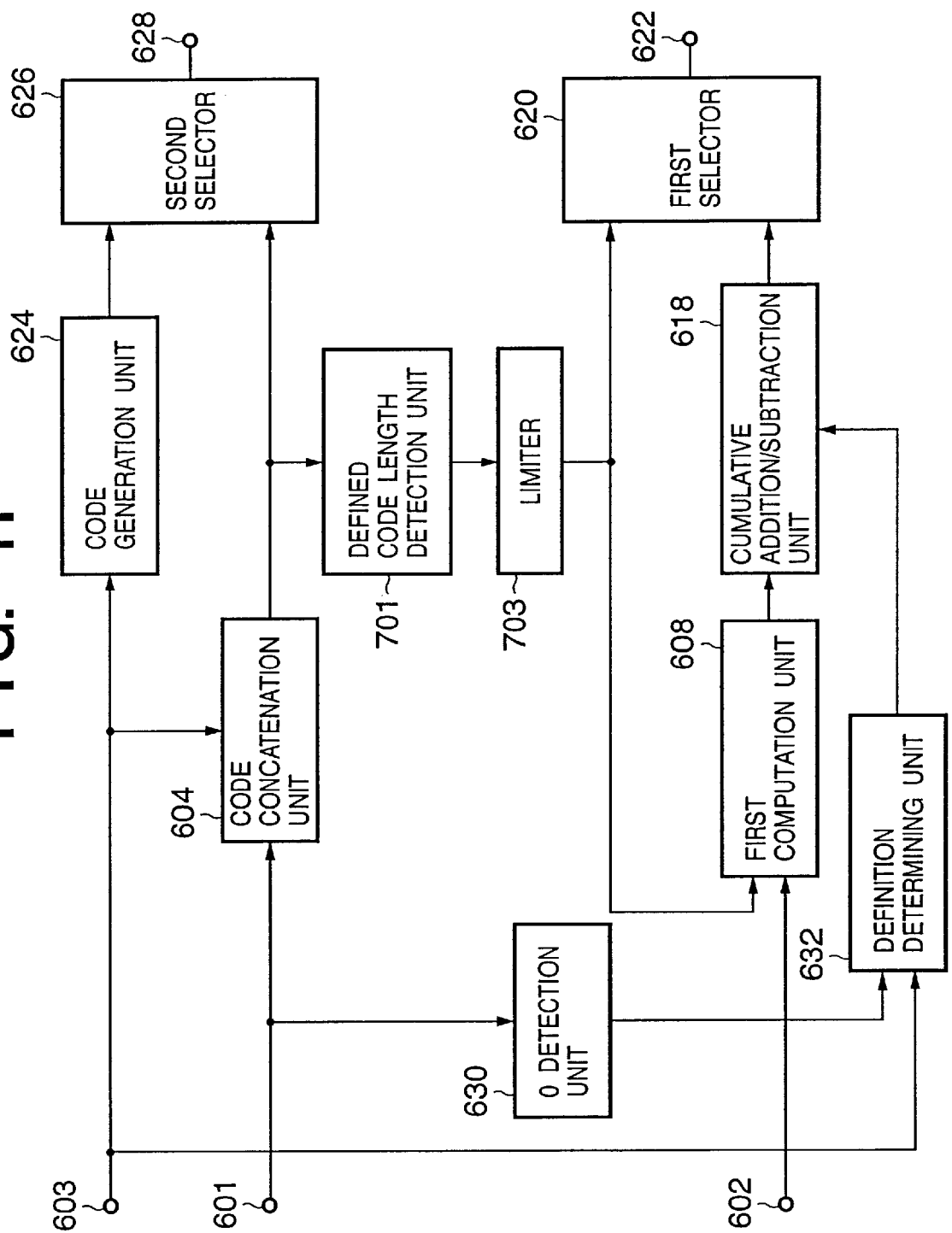
FIG. 11 is a block diagram showing a variation of the code converter according to the fifth embodiment.

The case will now be described where the number of bits of the defined code exceeds the bath wide of the output 628. This can be addressed by the configuration shown in FIG. 11. FIG. 11 is a block diagram showing a variation of the code converter according to the fifth embodiment. The case will be considered as an example where "01111111111" (11 bit code) and "1111111111110" (13 bit code) are inputted consecutively.

At the point in time when the "0111111111" is inputted and concatenated, all the previous codes become defined codes and are outputted to the outside. Then, when the "1111111111110" is inputted and outputted, the concatenated code becomes "01111111111111111111111110". In the concatenated code, only the last one bit is an undefined bit, and the 23 bits therebefore are defined codes.

At this time, the 23-bit defined code cannot be outputted at a time if the bath wide of the defined code that is outputted from the terminal 628 is 16. Then, as shown in FIG. 11, a limiter 703 is provided in the output side of the defined code length detection unit 701 to limit the above described detection value 23 to 16, before the value is sent to the first selector 620 and the first computation unit 608. This enables the above described 23-bit defined code to output 16 in the first cycle and output 7 bits in the next cycle.

Furthermore, this limiter 703 can also be applied to the above described first to fourth embodiments. In this case, however, some changes should be made as necessary due to the installation of the limiter 703, but detailed description thereof will not be given here. For example, there may be the case where a part of the defined code portion remains in the code concatenating portion to be dealt with after the defined code portion is removed, and thus the computation contents of the first computation unit and the second computation unit should be modified.

[Sixth Embodiment]

Figure 12:
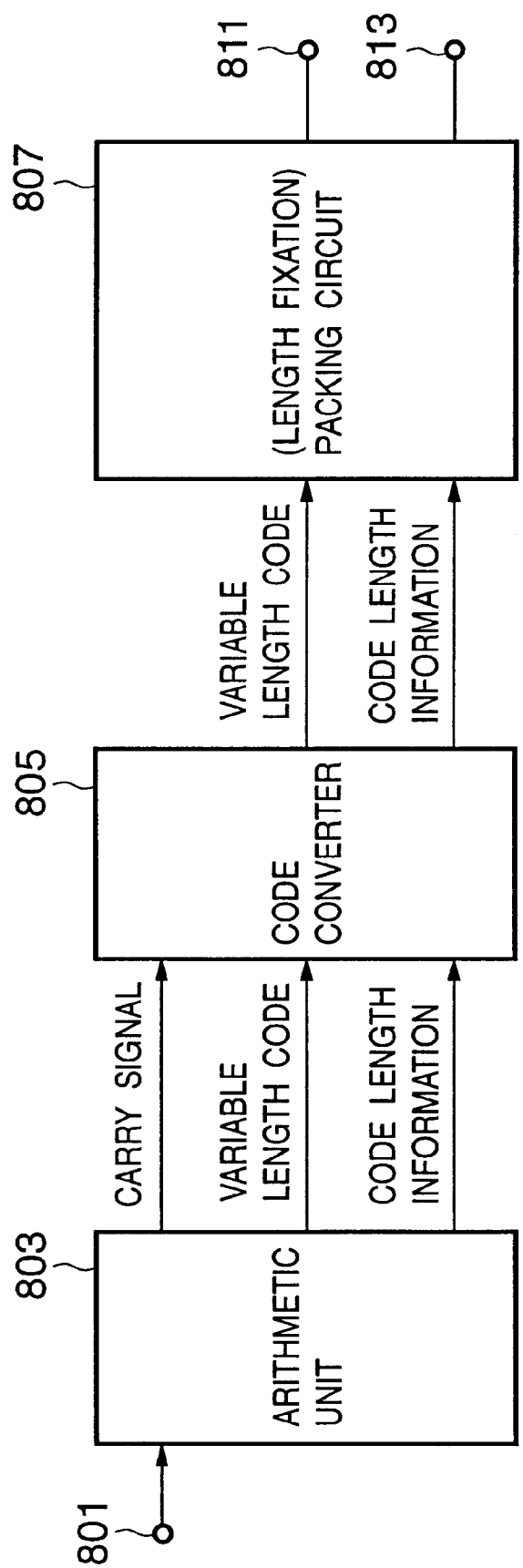
FIG. 12 is a block diagram illustrating a configuration of an arithmetic encoder according to a sixth embodiment.

FIG. 12 is a block diagram illustrating the configuration of the arithmetic encoder according to the sixth embodiment. In the sixth embodiment, an arithmetic encoder configured using the code converter described in the above described first to fifth embodiments will be described.

In FIG. 12, reference numeral 801 denotes a terminal for inputting binary data, etc. that are encoded, reference numeral 803 denotes an arithmetic computation unit determining arithmetic codes from the binary data inputted from the terminal 801, reference numeral 805 denotes the code converter described the above described first to fifth embodiments, reference numeral 807 denotes the general packing (length fixation) packing circuit shown in FIG. 2, reference numeral 811 is a terminal for outputting fixed length codes, and reference numeral 813 denotes a terminal for outputting signals indicating existence/not existence of the output of the fixed length code.

A multi-valued image captured from an input device such as a scanner is binarized through preprocessing such as noise removal and area division, and is inputted to the terminal 801 and sent to the arithmetic computation unit 803. The arithmetic computation unit 803 compares the inputted binary data with the value predicted in the arithmetic computation unit 803, performs arithmetic computation internally based on their consistency/inconsistency, and outputs a part of the computation result as a variable length code. Information that is outputted is the carry signal generated during computation, the variable length code and code length information of the variable code.

The three types of information are converted into the variable length code and code length information with no carry signal in the code converter 805, and are sent to the packing circuit 807. The packing circuit 807 performs fixation in length of this information and outputs the same in predetermined bits.

[Seventh Embodiment]

Figure 13:
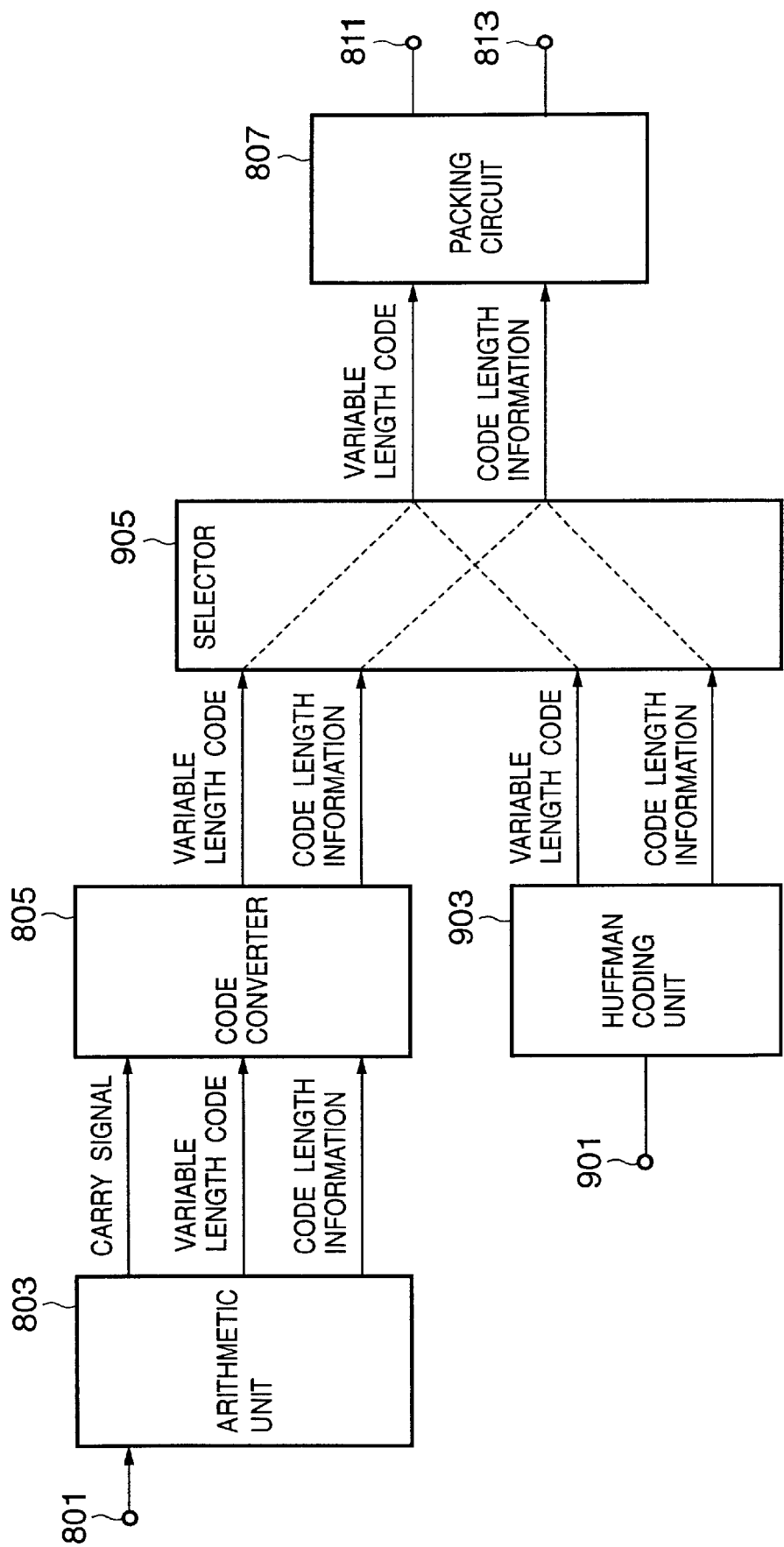
FIG. 13 is a block diagram showing a configuration of an encoder according to a seventh embodiment.

FIG. 13 is a block diagram showing the configuration of the encoder according to the seventh embodiment. For the seventh embodiment, a different coding function (Huffman encoder in this embodiment) is efficiently incorporated in the arithmetic encoder described in the above described sixth embodiment.

In FIG. 13, reference numeral 901 denotes a coded data input terminal, reference numeral 903 denotes a Huffman encoder, and reference numeral 905 denotes a selector switching the variable length code and the code length information in a batch. Other elements are same as those with identical numbers in the configuration (FIG. 12) described in the above described sixth embodiment.

By providing such a configuration, length fixation of a code encoded with an utterly different system can be performed with the same packing circuit 807. Furthermore, although the Huffman encoder 903 is used in this embodiment, this encoder is only shown as typical entropy coding, and it is apparent that other coding systems may be used.

[Eighth Embodiment]

Figure 14:
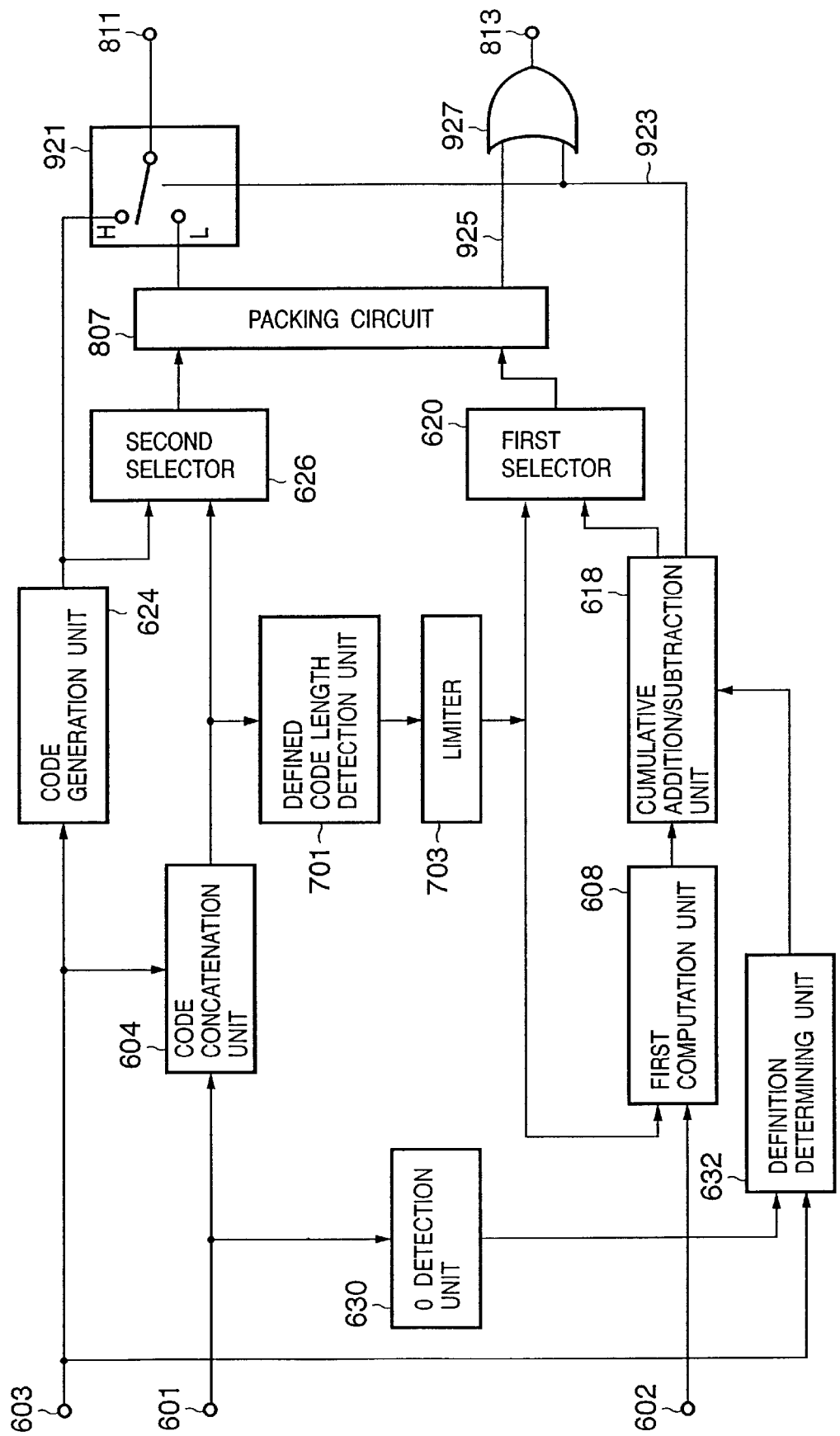
FIG. 14 is a block diagram showing a configuration of the code converter according to an eighth embodiment.

FIG. 14 is a block diagram showing the configuration of the code converter according to the eighth embodiment. For the eighth embodiment, the packing circuit 807 shown in FIG. 2 is incorporated in the code converter shown in FIG. 11 (fifth embodiment). Also, a third selector 921 and an OR element 927 are added, but their functions will be apparent from explanation of operations described below.

Now, the case will be considered where an undefined code with 16×W+R bits is counted in the cumulative addition/subtraction unit 618, and the undefined code is established, and is outputted. First, assume that R≠0 holds. Also, as described in the first embodiment, R bits are outputted in the first cycle, and each 16 are outputted W times in the next cycle and cycles thereafter. And, a code just as described in the first embodiment (the code in which the value of the first bit and the values of the second bit and bits thereafter are reversed) is outputted from the code generation unit 624.

The first R-bit code is inputted in the packing circuit 807 unconditionally, but if a 16-bit code is not outputted after packing, a 16-bit code is further inputted in the packing circuit 807. A code with 16 or more surely exists in the packing circuit if bits are inputted this far, and thus a 16-bit code fixed in length is outputted from the packing circuit. A code with 1 to 15 remains in the packing circuit after the fixed length code is outputted.

The output thereafter from the code generation unit 624 is outputted as a fixed length code directly to the terminal 811 not through the packing circuit 807 but through the third selector 921. A switching control signal 923 of the third selector 921 is supplied from the cumulative addition/subtraction unit 618, and the output from the code generation unit 624 is selected when the control signal is '1'. Also, the control signal is ORed in the OR element 927 with a signal 925 indicating existence/not existence of an output code outputted from the packing circuit 807 (the output occurs when the signal is '1') to become a signal indicating existence/not existence of the final output of the fixed length code, and is outputted to the terminal 813. Furthermore, the code with 1 to 15 left in the packing circuit 807 is concatenated to the code inputted in the packing circuit 807 and is outputted when the packing circuit 807 is subsequently used to generate a fixed length code.

On the other hand, if R=0 holds, a 16-bit code from the code generation unit 624 is inputted in the packing circuit 807 in the first cycle. In this case, since a fixed length code is surely outputted from the packing circuit 807 irrespective of whether or not the code remains in the packing circuit 807, a 16-bit code from the code generation unit 624 is outputted directly to the terminal 811 through a pass by way of the third selector 921 as described above, in the second cycle and cycles thereafter.

[Ninth Embodiment]

Figure 15:
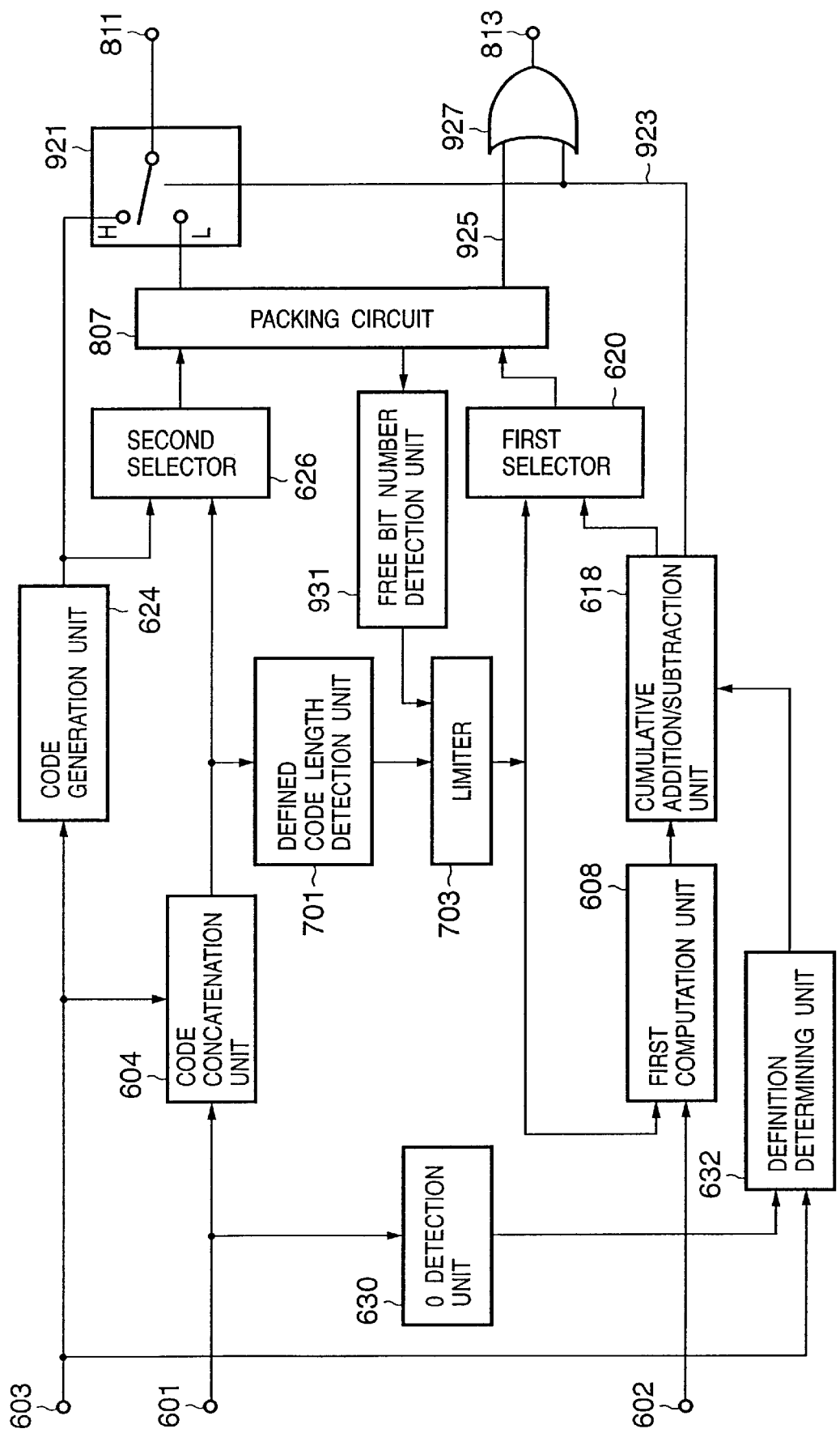
FIG. 15 is a block diagram showing a configuration of the code converter according to a ninth embodiment.

FIG. 15 is a block diagram showing the configuration of the code converter according to the ninth embodiment. For the eighth embodiment, one system of output from the code generation unit 624 is only shown, which does not means that a new functions is added. For the ninth embodiment, a new function is added to the eighth embodiment.

The function is a function of transferring the defined code in the code concatenating unit 604 to the packing circuit 807 while the code outputted from the code generation unit 624 is outputted directly to the terminal 811 via the third selector 921.

For the transfer at this time, unlike usual transfer of defined codes, only free bits in data bits retainable in the packing circuit 807 can be accepted. This is because the code outputted from the code generation unit 624 occupies the terminal 811, thus making it impossible to output the fixed length code from the packing circuit 807.

For processes for dealing with this problem, methods such as:

(1) a method in which free bits is detected, and defined bits as many as the free bits are transferred; and
(2) a method in which existence of N or more free bits is detected, and bits are transferred in N bits can be considered, but both of the methods have similar configurations.

That is, the number of bits that can be transferred to the packing circuit 807 is detected in a free bit number detection unit 931, and the upper limit of the limiter 703 is determined based on this number of bits. In the case of the above described method (1), the number of bits detected equals to the value of the upper limit of the limiter 703, and in the case of the method (2), the number of bits detected or N, whichever smaller, equals to the value of the upper limit of the limiter 703.

Thereby, it is possible to prevent the inputted variable length codes from being accumulated only in the code concatenating unit 604 during output of codes from the code generation unit 624, and distribute codes to the packing circuit 807. Consequently, the apparent register capacity of the code concatenating unit 604 is increased.

[Tenth Embodiment]

Figure 16:
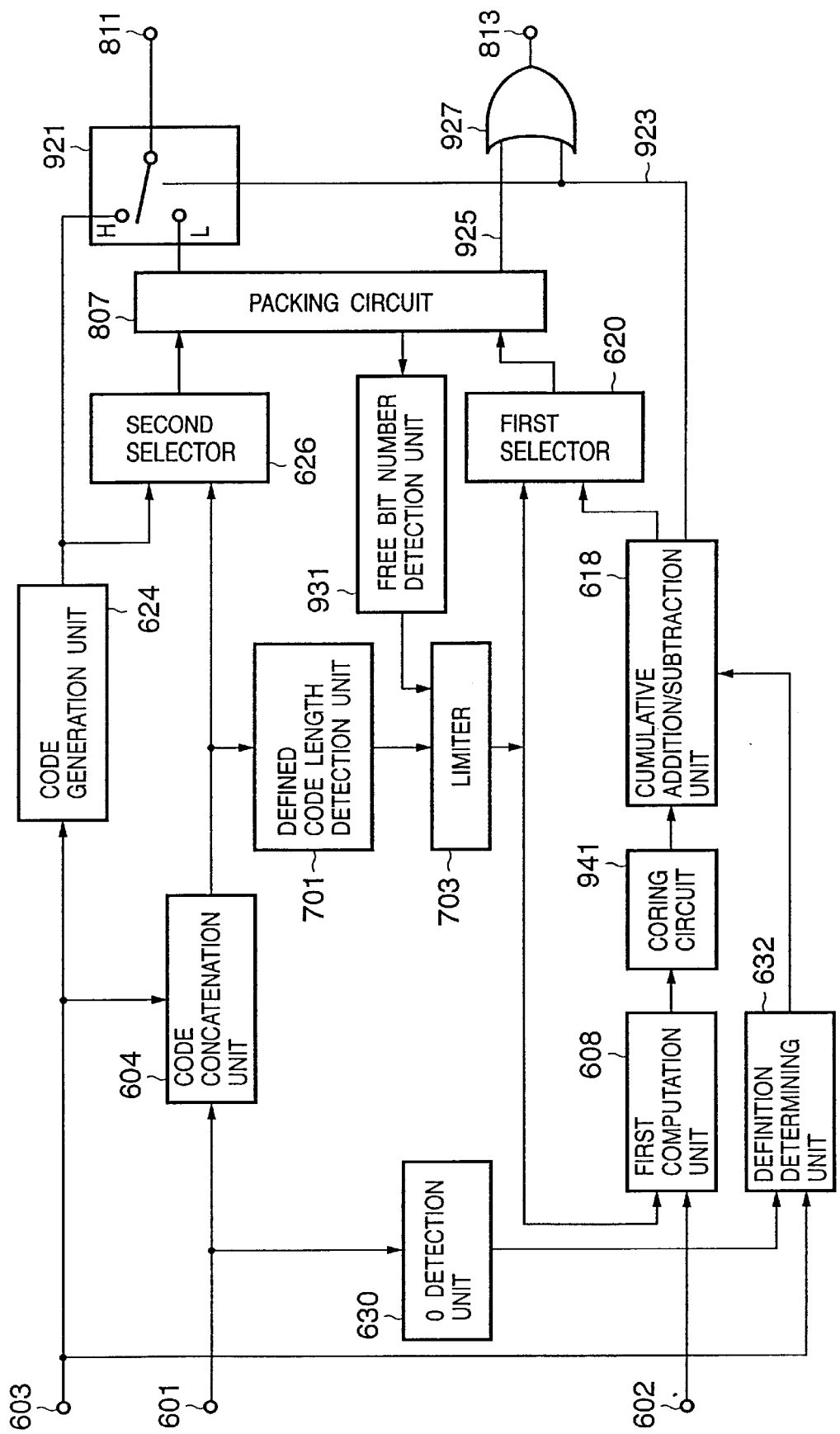
FIG. 16 is a block diagram showing a configuration of the code converter according to a tenth embodiment.

FIG. 16 is a block diagram showing the configuration of the code converter according to the tenth embodiment. For the code converter described in each previous embodiment, when no defined code exists and only an undefined code remains in the code concatenating unit 604, the code length of the undefined code (this is the output of the second computation unit, and also equals to the output of the first computation unit) is transferred to the cumulative addition/subtraction unit 618.

However, in the case where the variable length code is inputted in every alternate cycles, if the defined code in the code concatenating unit 604 is outputted, only the undefined code remains in the next cycle, and this code length is surely transferred to the cumulative addition/subtraction unit 618. However, it is likely that the undefined code becomes a defined code when the next variable length code is inputted, and thus waiting the variable length code and outputting the defined code after the undefined code changes to the defined code leads to higher throughput of the code converter. This is because it is inefficient to carry out the process of counting in the cumulative addition/subtraction unit 618 an undefined code with no more than 1 or two bits and outputting the undefined code when it is defined. However, once counting is started in the cumulative addition/subtraction unit, efficiency is not reduced even if an undefined code with 1 or 2 bits is counted.

Then, any of the following processing methods is applied.

(1) When the code length of the undefined code in the code concatenating unit 604 reaches a predetermined value or larger, the code length is transferred to the cumulative addition/subtraction unit 618.
(2) When the value of the cumulative addition/subtraction unit 618 is zero, the code length is not transferred to the cumulative addition/subtraction unit 618 unless the code length of the undefined code in the code concatenating unit 604 is a predetermined value or larger, but when the value of the cumulative addition/subtraction unit 618 is not zero, code length of any bit number is transferred.

The above described process (1) can be achieved only by adding a coring circuit 941 (a circuit for masking an input value to zero if the input value is smaller than a predetermined value, and outputting the input value directly if it equals to the predetermined value or larger). Also, the above described process (2) requires ON/OFF control of the coring property of the above described coring circuit 941 depending on the value of the cumulative addition/subtraction unit.

FIG. 16 shows a configuration for carrying out the above described process (1), but it is changed to a configuration for carrying out the above described process (2) if a signal for controlling the property of the coring circuit 941 from the cumulative addition/subtraction unit 618.

As described above, according to the tenth embodiment, cumulative addition of the undefined code length by the cumulative addition/subtraction unit 618 is not started until an undefined code exceeding a predetermined code length remains in the code concatenating unit 604 (processes (1) and (2)), and once cumulative addition is started, the code length of the undefined code remaining in the code concatenating unit 604 is cumulatively added immediately (process (2)), thus making it possible to perform code conversion processing efficiently.

As described above, according to the first to tenth embodiments, a system in which carry processing is completely performed before packing processing, and no carry signal is inputted in the packing circuit has been achieved.

This new system enables a conventional packing circuit to be used directly, and improves compatibility with other coding systems. This has brought about an advantage that design assets can be diverted and an advantage that a circuit can be shared in an integrated circuit having a function of coding with a plurality of coding systems.

Also, functionally, in conventional systems, there is no concept of defined codes, and therefore the defined code is not outputted the outside immediately, and continues to remain in the circuit in some cases, while in this system, the defined code is immediately sent to the packing circuit, and the undefined code is also sent to the packing circuit immediately after it is defined, thus providing the advantage that a concretely defined code is immediately outputted to the outside.

[Eleventh Embodiment]

In the following eleventh to eighteenth embodiments, a variety of configurations will be shown concerning a separator for the defined code and undefined code, which is an important component in processing the carry signal described in the above first to tenth embodiments.

In the block diagram of the code converter shown in FIG. 6, the signal that is transferred from the code concatenating unit 604 to the second selector 626 represents a defined code in the concatenated code, and the signal that is transferred from the first computation unit 608 to the cumulative addition/subtraction unit 618 represents an undefined code length in the concatenated code.

In the eleventh to eighteenth embodiments, a portion constituted by the code concatenating unit 604, the undefined code length detection unit 606, the first computation unit 608, the second computation unit 610 and the third computation unit 612 is a defined code/undefined code separator, and the configuration of this defined code/undefined code will be described in detail.

Figure 17:
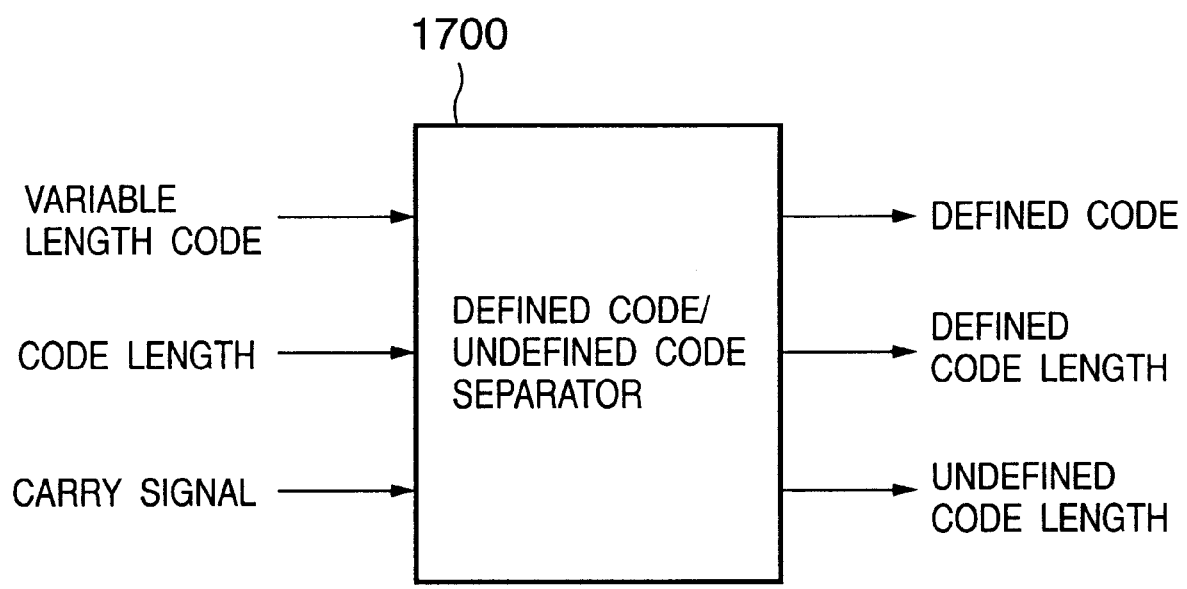
FIG. 17 shows input/output relationship of a defined/undefined code separator according to an eleventh embodiment.

The defined code/undefined code separator has a function of creating the above described concatenated code from three input signals of carrying, variable length code and code length, and outputting defined code and undefined code lengths, and input/outputs signals of the separator can be shown as in FIG. 17 if graphically illustrated more clearly. FIG. 17 shows input/output relationship of the defined code/undefined code according to the eleventh embodiment.

Figure 18:
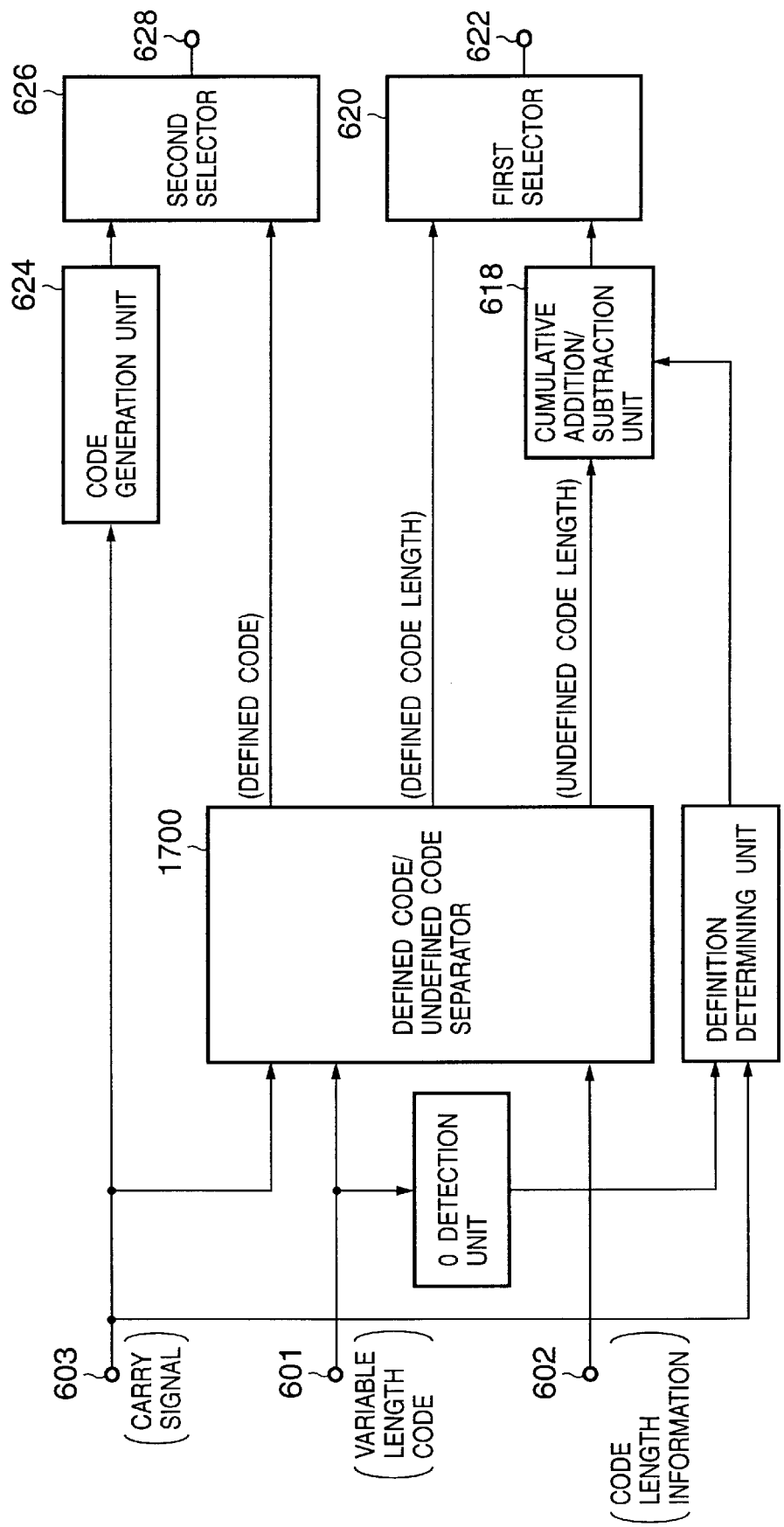
FIG. 18 is a diagram in which the code converter of FIG. 6 is rewritten using the defined/undefined code separator 1700 shown in FIG. 17.

Also, FIG. 18 is a diagram in which the code converter of FIG. 6 is rewritten using the defined/undefined separator 1700 shown in FIG. 17. For the variable length code, as will be described later, there are two types of codes, a front-packed code and a rear-packed, and concatenating process varies depending on which code is applied.

Figure 19:
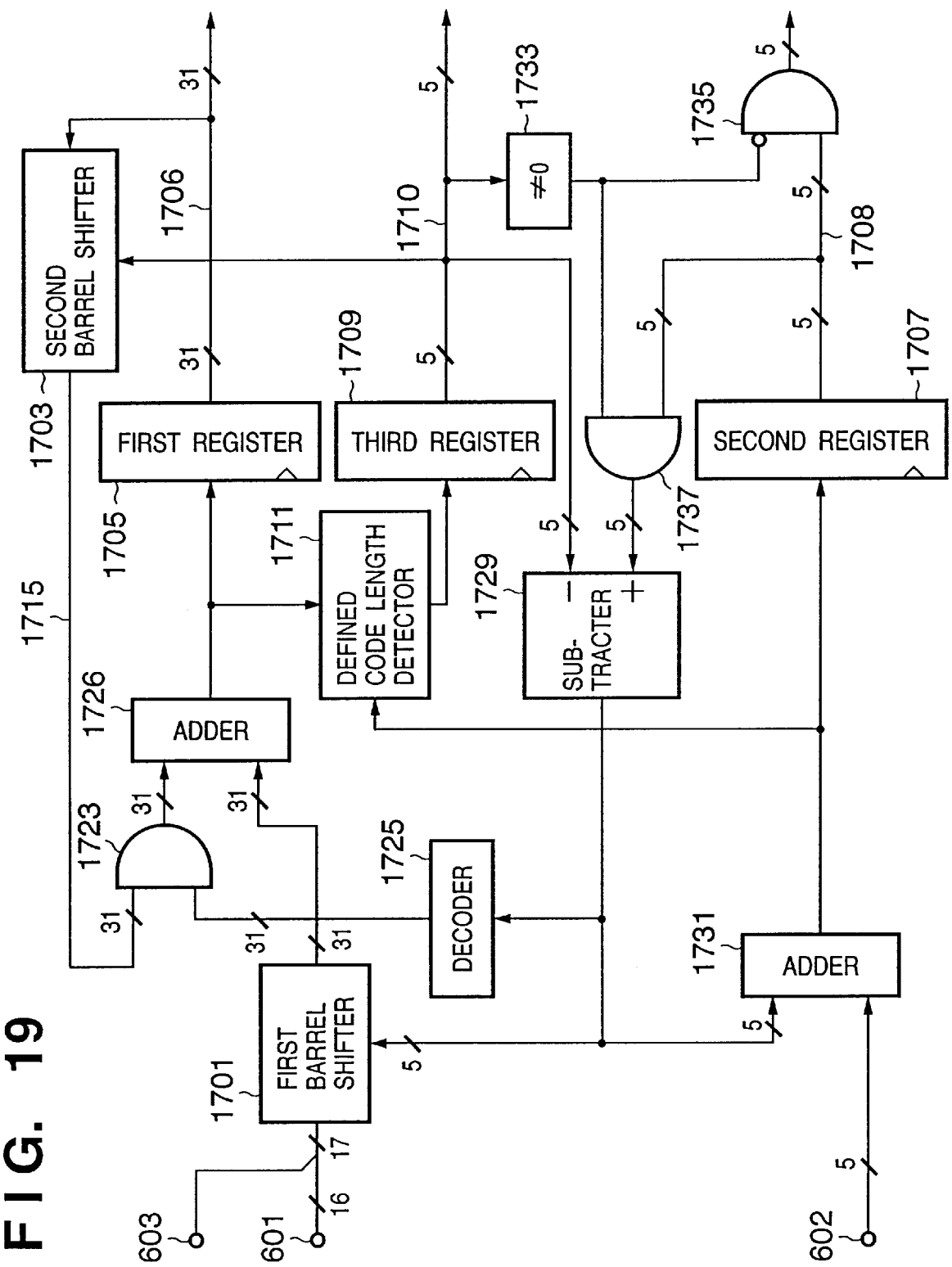
FIG. 19 is a block diagram showing a configuration of the defined/undefined code separator according to the eleventh embodiment.

FIG. 19 is a block diagram showing the configuration of the defined code/undefined code separator according to the eleventh embodiment. This embodiment deals with input of the front-packed variable-length code. The front-packed variable length code implies that when a 6-bit variable length code is transferred in a 16-bit bus, for example, a variable length code is placed for the first 6 bits. In this case, the last 10 bits are all '0' or undetermined. In this connection, the rear-variable length code implies that a variable code length is placed for the last 6 bits, and in this case, the first 10 bits are all '0' or undetermined.

In FIG. 19, reference numerals 601, 602 and 603 denote input terminals same as those in FIG. 6. Reference numeral 1701 denotes a first barrel shifter for shifting carry signals and input variable length codes, reference numeral 1703 denotes a second barrel shifter for shifting the concatenated codes, reference numeral 1705 denotes a first register retaining concatenated codes, reference numeral 1706 denotes concatenated code information retained in the first register 1705, reference numeral 1707 denotes a second register retaining concatenated code length, reference numeral 1708 denotes concatenated code length information retained in the second register 1707, reference numeral 1709 denotes a third register retaining defined code length in the concatenated code, reference numeral 1710 denotes defined code length information retained in the third register 1709, reference numeral 1715 denotes concatenated code information from which outputted defined information is deleted, reference numeral 1723 denotes an AND element group masking unnecessary signals other than concatenated codes, reference numeral 1725 denotes a decoder generating signals that are given to the AND element group 1723, reference numeral 1726 denotes an adder for adding a carry signal to the concatenated code after output the defined code to add a new input variable length code, reference numeral 1729 denotes a subtracter for subtracting defined code length information retained in the third register 1709 from concatenated code length information retained in the second register 1707, reference numeral 1731 denotes an adder for adding input code length information to the result of the subtraction, reference numeral 1733 denotes a detector detecting that the defined code length information retained in the third register 1709 is not zero, and reference numerals 1735 and 1737 denote mask circuits masking the signal 1708 based on the detection result of the detector 1733.

In the eleventh embodiment, the input variable length code has maximum 16, the couple code length is maximum 31 bits, and the output of the defined code has maximum 31 bits.

First, through initialization processing, the second register 1707 retaining the concatenated code length and the third register 1709 retaining the defined code length are cleared to zero. Thereby, the subtraction result output of the subtracter 1729 becomes zero, and all signals generated in the decoder 1725 become '0'. Then, the signals are sent to the ADD element group 1723, and all the concatenated code signals are masked to '0'.

At this time, assume that 5-bit variable length code "01101" is inputted in the terminal 601 (the remaining 11 bits may be any of 0 and 1, but they are all '0' in this case).

This variable length code is passed through the barrel shifter 1701 (the shift amount is 0 bit at this time: with the first bit of the variable length code as a reference), and is added and combined to the first 5 bits of the concatenated code by the adder 1726. Thereby, 31 bits of output of the adder 1726 has the first 5 bits of "01101" and the remaining 26 bits of all '0'.

On the other hand, code length information '5' that is inputted from the terminal 602 is added to the output value '0' of the subtracter 1729 in the adder 1731, and the addition result '5' is transferred to the second register 1707 and the defined code length detector 1711.

The defined code length detector 1711 detects the length of the defined code in the concatenated code from the above described 31-bit signal. The 31-bit signal that is inputted to the defined code length detector 1711 has a value of "0110100000000000000000000000000". Detecting a defined code from this signal by the method (b) shown in the first embodiment (in which '0' is searched for from the least significant bit towards the most significant bit, and it is determined that the code constituted by bits in the range of from the first found bit of '0' to the least significant bit is an undefined code, and the code constituted by bits thereabove is a defined bit) results in the defined code with 30 bits, which is larger than in length the concatenated code.

Then, the value of '5' sent from the adder 1731 is decoded to obtain a signal having the first 5 bits of '0' and the remaining 26 bits of '1', and the signal is ORed with the above described 31-bit signal to obtain a value of "0110111111111111111111111111111". Using this signal to detect a defined code by the above described method (b) results in the defined code with 3 bits, and thus a desired result can be obtained. The circuit required for this detection is an encoder called priority encoder, which is widely and generally used.

If the values of the first to third registers (1705, 1707 and 1709) after the initial variable length code is inputted are summed up, here, they are output of the first register (1705): "0110100000000000000000000000000"

output of the second register (1707): "00101" ('5' for decimal operation)

output of the third register (1709): "00011" ('3' for decimal operation). In the next cycle, the defined code is outputted, and a new variable length code is inputted.

In the eleventh embodiment, the output of the defined code is a maximum 31-bit code, and thus the output value 1706 of the above described first register 1705 is outputted directly as a defined code. Also, for the output of defined code length, the output value 1708 of the second register 1707 is directly outputted. Thereby, it can be understood that an valid defined code is constituted by 3 bits in the 31-bit output of the first register 1705. Also, this 31-bit signal is sent to the barrel shifter 1703, and is shifted by 3 bits in by the shifter, and a 31-bit signal (1715) of "0100000000000000000000000000000" is outputted.

Since the output value of the third register 1709 is not zero, the output value of the second register 1707 is directly sent to the subtracter 1729, and the signal that is outputted to the outside is masked to zero by the mask circuit 1735.

The subtracter 1729 subtracts the output value of the third register 1709 from the output value of the second register 1707, and outputs the value '2' ('5'–'3'). The result of this subtraction represents the number of bits of the valid concatenated code, and is sent to the decoder 1725 and the barrel shifter 1701. The decoder 1725 generates and decodes a 31-bit signal of "1100000000000000000000000000000" for the input value '2'.

The above described decoder output is an output for masking unnecessary data other than the valid concatenated code, and the masking process is carried out by the AND element group 1723. For the above described example value, the need for the masking process is not apparent, and this is because the non-valid code of the input variable length code is assumed as '0'. If any signal exists in an area other than the valid code, the signal also enters the concatenated code, and a problem arises when a next variable length code is concatenated. Therefore, the above described masking process is carried out to avoid the problem. The concatenated code after the masking process is carried out is sent to the adder 1726, and a next input code is concatenated thereto.

At this time, assume that a carry signal='1', a variable length code="010110111" and code length=9 bits are inputted as the next input.

The carry signal that is inputted from the terminal 603 is added to the front of the variable length code that is inputted from the terminal 601 to form a signal 0f "1010110111". With this signal is shifted by the first barrel shifter 1701 so that the position of the first bit of the variable length code is shifted by 2 bits, the "01010110111" is outputted. This value is added (concatenated) to the concatenated code after the masking process ("01000000000000000000000000000000" in this example) in the adder 1726, and 31 bits of "1001011011100000000000000000000" are outputted from the adder 1726.

The concatenated code outputted in this way is sent to the first register 1705 and the defined code length detector 1711. In the defined code length detector 1711, the area other than the valid code is replaced with '1', and the defined code length is detected as 7 bits. This value is sent to the third register 1709 and retained therein. Also, the code length input value '9' is added by the adder 1731 to the subtraction result '2' obtained by the above described subtracter 1729, and the addition result '11' is sent to the second register 1707 and retained therein. At this point, if the values of the first to third registers are summed up (1705, 1707 and 1709), they are output of the first register: "1001011011100000000000000000000"

output of the second register: "01011" ('11' for decimal operation)

output of the third register: "00111" ('7' for decimal operation).

Therefore, in the next cycle, a defined code with 7 bits is outputted to the outside, and since the output of the third register is not zero, the value of the second register is masked to zero and outputted to the outside.

As long as the defined code exists in the concatenated code, the retained value of the second register equals (defined code length+undefined code length), but if the defined code length becomes 0, the retained value is no more than the undefined code length, and thus the value is a valid value and is outputted to the outside without being basked to zero. At this time, the value that is sent to the subtracter 1729 is masked to zero by the mask circuit 1737.

Figure 20:
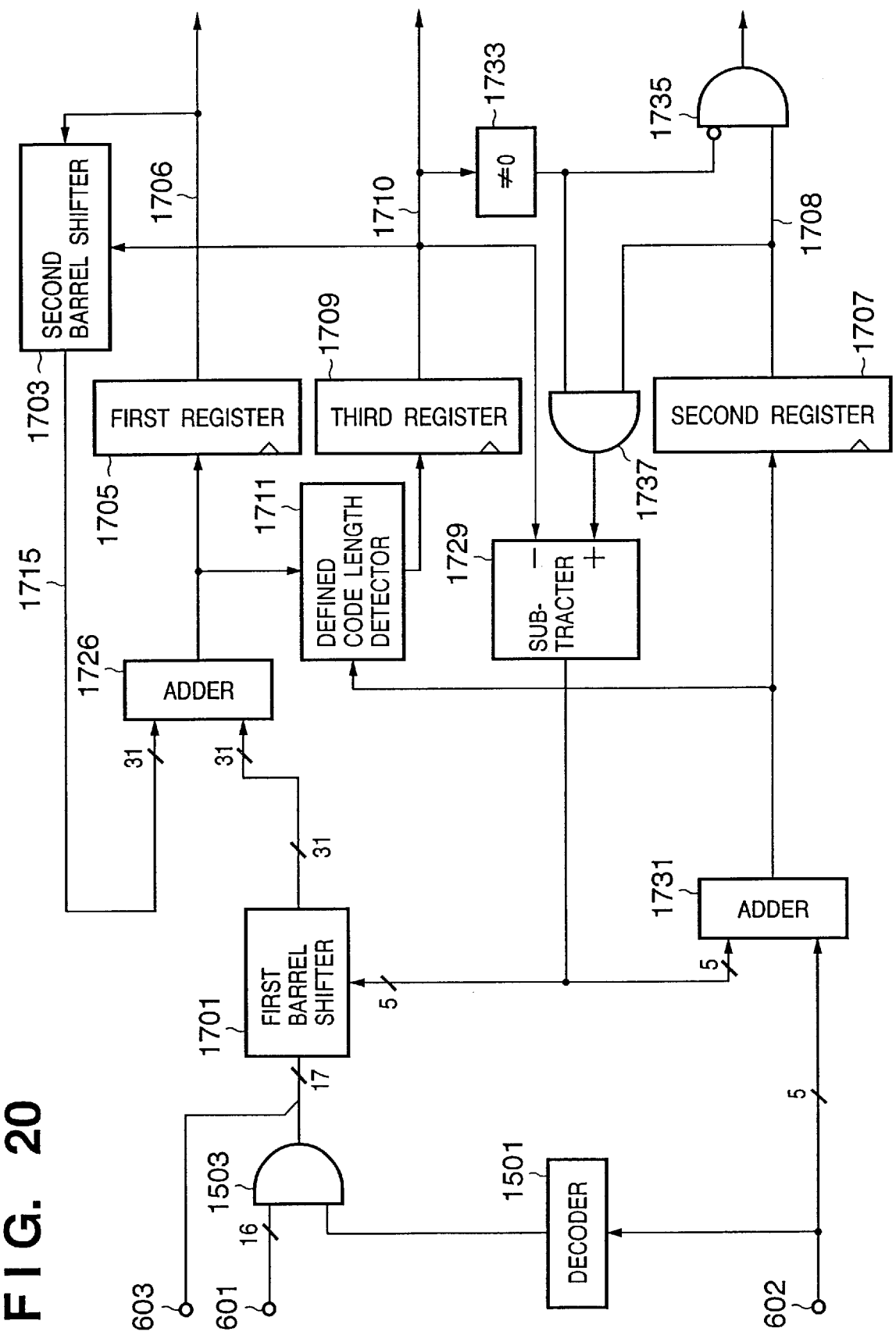
FIG. 20 is a block diagram showing a variation of the defined/undefined code separator according to the eleventh embodiment.

Explanation associated with FIG. 19 has been described above. A variation of the above described first embodiment will now be described. FIG. 20 is a block diagram showing a variation of the defined code/undefined code separator according to the eleventh embodiment. In FIG. 20, a decoder 1501 and an AND element group 1503 are used in place of the decoder 1725 and the AND element group 1723 shown in FIG. 19.

As described above, if any signal exists in an area other than the valid code of the input variable length code, the signal enters the concatenated code, and a problem arises when a next variable length code is concatenated. The decoder 1725 and the AND element group 1723 in FIG. 19 are provided to avoid the problem.

However, if it is ensured that the area other than the valid area of the input variable length code is all '0', the above described decoder 1725 and the AND element group 1723 are not required. Thus, the decoder 1501 and the AND element group 1503 are used to mask to zero the area other than the valid area of the input variable length code, thereby making it possible to make the decoder 1725 and the AND element group 1723 unnecessary. In this case, while the bus width (bit length) that the AND element group 1723 in FIG. 19 has is 31, the bus width (bit length) that the AND element group 1503 in FIG. 20 has is no more than 16, thus enabling the circuit to be simplified.

[Twelfth Embodiment]

Figure 21:
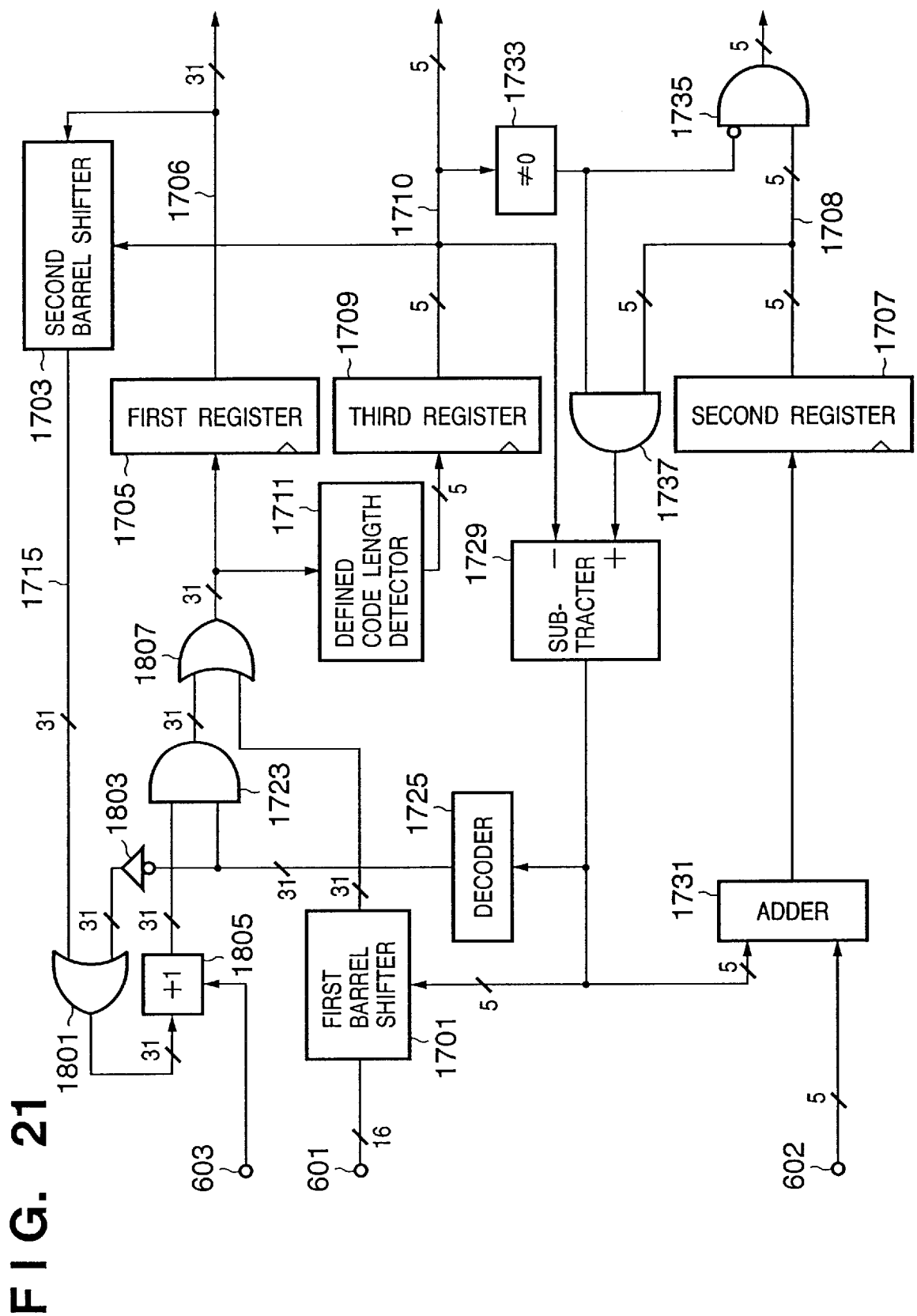
FIG. 21 is a block diagram showing a configuration of the defined/undefined code separator according to a twelfth embodiment.

FIG. 21 is a block diagram showing the configuration of the defined code/undefined code separator according to the twelfth embodiment. The twelfth embodiment also deals with input of the front-packed variable length code, and the input variable length code has maximum 16, the concatenated code length is maximum 31 bits, and the output of the defined code has maximum 31 bits.

In FIG. 21, reference numeral 1801 denotes an OR element group adding "11 . . . 11" to the rear of the concatenated code, reference numeral 1803 denotes a NOT element group generating the above described "11 . . . 11", reference numeral 1805 denotes an increment circuit performing addition of the carrying input signal, and reference numeral 1807 denotes an OR element group concatenating a variable length code to the concatenated code after output of the defined code. Furthermore, other elements have functions of those with identical numbers in the FIG. 19 showing the configuration of the above described eleventh embodiment.

In the above described eleventh embodiment, since the carry signal is added to the concatenated code after output of the defined code, and the 31-bit adder is used to couple a next variable length code, operation delay time is significant.

In contrast to this, in the twelfth embodiment, some idea is put into addition of the carry signal, wherein the increment circuit 1805 in which only 1 is added to the 31-bit signal. This increment circuit 1805 is a general circuit known as a circuit for determining a next up-count value in a synchronous up-counter, and its circuit scale and delay time are significantly reduced compared to the aforesaid 31-bit adder.

In the following, the feature of the twelfth embodiment will be clarified by describing principally differences with the eleventh embodiment. Assume that '2' is inputted in the decoder 1725 after input of the first 5-bit variable length code "01101", as in the case of the eleventh embodiment.

The decoder 1725 generates and decodes a 31-bit signal of "1100000000000000000000000000000" for the input value '2'. This 31-bit signal is reversed by the NOT element group 1803 to become a 31-bit signal of "0011111111111111111111111111111".

The output signal of this NOT element group 1803 is ORed with concatenated code information after output of the defined code in the OR element group 1801 to form 31-bit information of "0111111111111111111111111111111", which is sent to the increment circuit 1805.

Here, the reason why all the lower bits of the concatenated code to the first 2 bits are '1' is that input of the carry signal is propagated to the least significant bit of the concatenated code (after output of the defined code), and the carry signal is added to the least significant bit. If the carry signal is '1', every '1' for propagation of the carry signal is changed to '0', and '1' is added to the least significant bit of the concatenated code. On the other hand, if the carry signal is '0', every '1' for propagation of the carry signal remains '1' without being changed. Every signal '1' for propagation of the carry signal, which becomes unnecessary after carry signal addition process is masked to '0' by the AND element group 723.

Thereafter, a subsequently inputted variable length code is ORed by the OR element group 1807. Other processes are same as those of the eleventh embodiment, and description thereof is thus omitted.

[Thirteenth Embodiment]

FIG. 22 is a block diagram showing the configuration of the defined code/undefined code separator according to the thirteenth embodiment. The thirteenth embodiment also deals with input of the front-packed variable length code, and the input variable length code has maximum 16, the concatenated code length is maximum 31 bits, and the output of the defined code has maximum 31 bits.

In FIG. 22, reference numeral 1901 denotes an exclusive-OR element group for reversing the undefined code depending on the value of the carry signal that is inputted from the terminal 603. In the eleventh and twelfth embodiments described above, since the defined code in the concatenated code retained in the first register 1705, the defined code is removed in the second barrel shifter 1703, and only the undefined code remains in the output of the second barrel shifter 1703 (in some cases, no code remains).

As described previously, if the carry signal is a carry signal, the whole of the undefined code is reversed when the value of the carry signal is '1'. Therefore, it is necessary to be able to reverse the output signal 1715 of the second barrel shifter 1703 only when the carry signal is '1', and thus the circuit for performing of addition of the carry signal can be further simplified as compared to the second embodiment. And, it is the exclusive-OR element group 1901 that performs this reverse processing.

A five-bit variable length code "01101" is first inputted, and the barrel shifter output signal 1715 after the defined code is outputted and removed therefrom is "01000000000000000000000000000000", and when the carry signal '1' is inputted therein, the above described code is reversed in the exclusive-OR element group 1901 to form "10111111111111111111111111111111". Thereafter, unnecessary bits are masked to '0' to form "10000000000000000000000000000000". This is ORed with a next 9-bit variable length code "010110111" that is inputted from the terminal 601, with the variable length code shifted by 2 bits in the barrel shifter 1701. In this way, a new concatenated code of "10010110111000000000000000000000" can be obtained.

Other processes are same as those of the eleventh embodiment, and description thereof is thus omitted.

[Fourteenth Embodiment]

Figure 23:
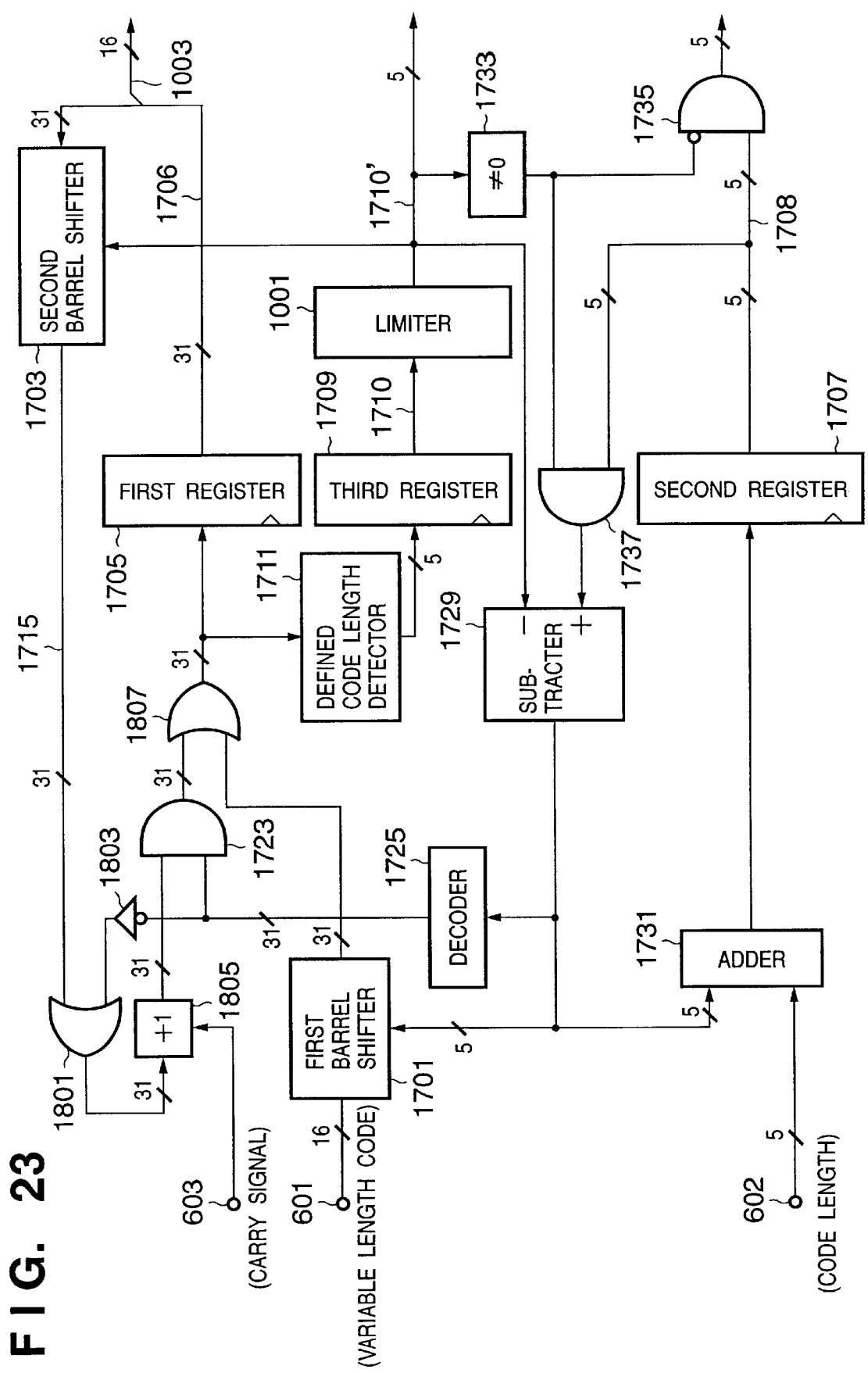
FIG. 23 is a block diagram showing a configuration of the defined/undefined code separator according to a fourteenth embodiment.

FIG. 23 is a block diagram showing the configuration of the defined code/undefined code separator according to the fourteenth embodiment. The fourteenth embodiment also deals with input of the front-packed variable length code, and the input variable length code has maximum 16 and the concatenated code length is maximum 31 bits. However, for the defined code, only 16 can be outputted at the maximum in one cycle.

Therefore, in the fourteenth embodiment, unlike the eleventh to thirteenth embodiment described previously, there may be cases where the defined code still remains in the concatenated code after output of the defined code, and thus the method of addition processing for carry signals as in the thirteenth embodiment described above cannot be used, However, the method of addition processing for carry signals as in the twelfth embodiment can be used, and thus this method will be used in the fourteenth embodiment.

In the fourteenth embodiment, an Upper 16-bit signal 1003 of the output signal 1706 of the first register 1705 is outputted as a defined code signal. Also, the output signal 1710 of the third register 1709 cannot be outputted directly, and thus it is sent to the outside after it is passed through the limiter 1001 to define the upper limit as 16. An output signal 1710' of the limiter 1001 substitutes as the output signal 1710 of the third register 1709, and the output signal 1710' of the limiter 1001 is also sent to the second barrel shifter 1703 and the subtracter 1729.

Thereby, even if a 20-bit defined code exists, and the value of '20' is detected from the defined code length detector 1711, the defined code is processed/outputted apparently assuming that a 16-bit defined code exists and detected because the upper limit has been defined as 16 by the limiter 1001.

In this case, since a 4-bit defined code remains in the output of the second barrel shifter 1703, the method of addition processing for carry signals as in the aforesaid thirteenth embodiment cannot be used. The remaining 4-bit defined code will be surely outputted in the next cycle. However, if a newly defined code has 13 bits or more due to a newly inputted variable length code, the defined code cannot be fully outputted and a part thereof will remain in the next cycle.

In this way, other processes are the same as those of the second embodiment except that the defined code cannot be fully outputted at a time and a part of the defined code remains, and description of other processes is thus omitted.

[Fifteenth Embodiment]

Figure 24:
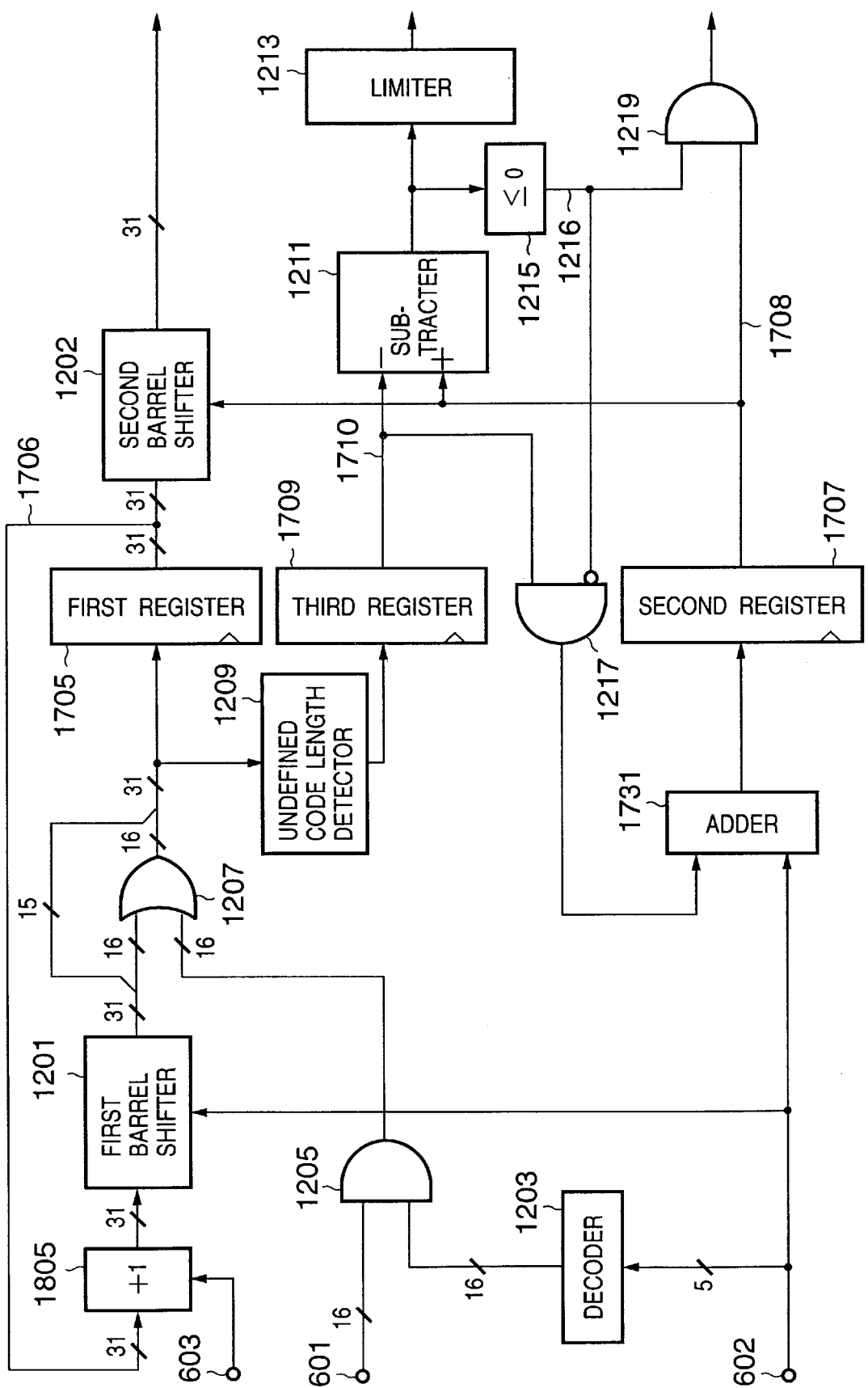
FIG. 24 is a block diagram showing a configuration of the defined/undefined code separator according to a fifteenth embodiment.

FIG. 24 is a block diagram showing the configuration of the defined code/undefined code separator according to the fifteenth embodiment. The fifteenth embodiment deals with input of the rear-packed variable length code, and the input variable length code has maximum 16, the concatenated code length is maximum 31 bits, and the output of the defined code has maximum 31 bits.

In FIG. 24, reference numeral 1201 denotes a first barrel shifter for shifting the concatenated code based on input code length information, reference numeral 1202 denotes a second barrel shifter for shifting the concatenated code based on concatenated code length information, reference numeral 1203 denotes a decoder generating signals for masking non-valid bits of the rear-packed variable length code to '0', reference numeral 1205 denotes an AND element group masking input variable length codes based on the output signal of the decoder, reference numeral 1207 denotes an OR element group concatenating a part of the concatenated code to the masked input variable length code, reference numeral 1209 denotes an undefined code detector detecting the undefined code length in the concatenated code, reference numeral 1211 denotes a subtracter subtracting the undefined code length from the concatenated code length to determine the defined code length, reference numeral 1213 denotes a limiter limiting the input of a negative value smaller than zero to zero, reference numeral 1215 denotes a detector detecting that the output value of the above described subtracter smaller than or equal to zero, and reference numerals 1217 and 1219 denote mask circuits masking signals depending on the detection result of the detector 1215.

The initialization operation is not described here, and assume that an initial variable length code "01101" (5-bit) is inputted in the terminal 601. Assume that the 5-bit code is located in the place of the lower 5 bits of a 16-bit bus, and the remaining first 11 bits are undefined bits. Code length information is inputted in the terminal 602, and the decoder

1203 outputs "0000000000011111" based on the code length information. IF this decoder output is sent to the AND element group 1205, and the input variable length code is masked, "0000000000001101" is obtained as the mask output. This is added to the concatenated code by the OR element group 1207.

The first register 1705 retaining the concatenated code may or may not clear all bits to zero in the initialization operation. All bits remain undefined unless they are cleared to zero, but it causes no problems, as described below.

Before the above described 5-bit variable length code is added to the concatenated code, the concatenated code is shifted upward by 5 bits with the first barrel shifter 1201, and "00000" is put in as lower five bits. This variable length code inputted in the place of the lower 5 bits is ORed by the OR element group 1207, and these lower 5 bits become "01101". At this time, the remaining first 26 bits are still undefined.

The above described concatenated code information is sent to the undefined code length detector 1209 and the first register 1705, and the undefined code length detector 1209 detects the undefined code length by the aforesaid method (b) (in which '0' is searched for from the least significant bit towards the most significant bit, and it is determined that the code constituted by bits in the range of from the first found bit of '0' to the least significant bit is an undefined code, and the code constituted by bits thereabove is a defined bit). In this case, detection can be made only with a priority encoder detecting '0' with the highest priority given to the least significant bit. The result of detection for the above described data input is 2-bit. This detection result is retained in the third register 1709.

On the other hand, in the second register 1707, the value of '5' that is the code length of the first variable length code is retained as a concatenated code length. The output 1708 of the second register 1707 is sent to the second barrel shifter 1202 and the subtracter 1211.

The second barrel shifter 1202 shifts the output 1706 of the first register 1707 based on the concatenated code information from the second register 1707, so that the first bit of the concatenated code is the first bit of the output of the barrel shifter.

For the input of the second barrel shifter 1202 after the above described 5-bit variable length code is inputted, a concatenated code exists in the lower 5 bits of the 31-bit signal inputted from the first register 1705, and the value of '5' is inputted from the second register 1707. This value of '5' is "00101" if considered as a binary number, and the value becomes "11010" (26 if considered as a decimal number) when it is reversed. Then, when the output 1706 of the first register 1705 is shifted upward by 26 bits with the second barrel shifter 1202, the first bit of the concatenated code becomes the first bit of the 13-bit output of the barrel shifter. At this time, '0' is entered for all the lower 26 bits having no information originally.

The subtracter 1211 subtracts the undefined code length from the concatenated code length to output the defined code length. In this case, the value of '3' is outputted as a result of subtraction computation of "5−2=3". This result of subtraction is outputted to the outside through the limiter 1213.

The limiter 1213 limits the result of subtraction of the subtracter 1211 to zero if it is a negative value. For example, if the code contents of the concatenated code are all '1', the output of the undefined code length detector 1209 takes on a value larger than or equal to (concatenated code length+1), and therefore subtraction this value from the concatenated code length results in a negative value. The limiter 1213 limits such a resulting negative value to zero and outputs the same to the outside.

On the other hand, the subtraction result of the subtracter 1211 is also sent to the detector 1215 detecting a value smaller than zero. When the resulting value is larger than or equal to 1, the output 1216 of the detector 1215 takes on '0', and the output 1708 of the second register 1707 is masked to zero in the mask circuit 1219, and is outputted to the outside. Then, the output of the third register 1709 is sent to the adder 1731 through the mask circuit 1217. In the case of input of the '5'-bit variable length code, the value of '3' is sent to the adder 1731.

In the next cycle, when a carry signal '1' and a 9-bit variable length code "010110111" are inputted, 1 is added to the 31-bit output signal of the first register 1705 in the increment circuit 1805, for the carry signal. At this time, the 31-bit signal is "0000000000000000000000000001101", and when a carry signal '1' is added thereto, it becomes "0000000000000000000000000001110".

This is shifted upward by 9 bits with the first barrel shifter 1201 to become "0000000000000000001110000000000".

Then, the above described 9-bit variable length code "010110111" is ORed therewith to form "0000000000000000001110010110111".

5+9=14 bits are exist in total in the above described code, but the 3-bit defined code is already outputted, and thus the current concatenated code length is 11 bits, and the second register 1707 retains and outputs the value of '11'. Also, the undefined code length detected from the 31-bit signal is 4 bits, and this value is retained and outputted by the third register 1709. Therefore, the defined code length that is subsequently outputted from the subtracter 1211 is 11−4=7 bits.

Receiving the output value '11' of the second register 1707, the second barrel shifter 1202 shifts the output value (31-bit signal) of the first register 1705 by 31−11=20 bits, and outputs "1001011011100000000000000000000". And, in this 31-bit signal, the first 7 bits constitute a defined code.

Assume that in the next cycle, a carry signal='0' and a 4-bit variable length code "1111" are further inputted. At this point, the 31-bit output signal of the first register is "0000000000000000001110010110111", and if this is shifted upward by the length of the variable length code inputted from the terminal 602, namely by 4 bits with the first barrel shifter 1201, the output signal becomes "0000000000000111001011011110000"

Then, a 4-bit variable length code "1111" that is inputted from the terminal 601 is ORed therewith by the OR element group 1207 to form "0000000000000111001011011111111".

The not-yet-outputted concatenated code length in this 31-bit signal is 4+4=8 bits, and this value of '8' is retained and outputted by the second register.

Also, the undefined code length detected from this 31-bit signal is 8 bits, and this value is retained and outputted by the third register. The result of computation in the subtracter 1211 is 8−8=0 bits, and the code length that is outputted next is 0 bits.

The detector 1215 detects this subtraction result 0 to output '1', and outputs through the mask circuit 1219 the value of the result of addition (8) of the adder 1731 that is outputted from the second register 1707, as an undefined code length. Thereby, the concatenated code retained in the first register 1705 is fully outputted, resulting in concatenated code length=0 bits. In association therewith, a value that is sent to the adder 1731 as a feedback is masked to zero in the mask circuit 1217.

Furthermore, assume that in the next cycle, a carry signal='0' and a 2-bit variable length code '11' are inputted.

The 31-bit output signal of the first register is "0000000000000011100101101111111", and if this is shifted upward by 2 bits with the first barrel shifter 1201, it becomes "00000000000011100101101111111100".

Then, the inputted 2-bit variable length code "11" is ORed to form "00000000000011100101101111111111".

The not-yet-outputted concatenated code length in the above described 31-bit signal is only 2 bits, and this value of '2' is retained and outputted by the second register 1707. Also, the undefined code length that is detected from this 31-bit signal is 10 bits, and it is processed without any problems as described below.

The result of computation in the subtracter 1211 is 2−10=−8, which is limited to zero by the limiter 1213, and the code length that is outputted next is 0 bits. The detector 1215 detects this subtraction result of −8 to outputs '1', and outputs through the mask circuit 1219 the value of the result of addition (2) from the adder 1731 that is outputted via the second register 1707 as an undefined code length. As in the case of the aforesaid cycle, since the concatenated code retained in the first register 1705 is fully outputted, resulting in concatenated code length=0 bits, a value that is sent to the adder 1731 as a feedback is masked to zero in the mask circuit 1217.

As described above, according to the fifteenth embodiment, input of the rear-packed variable length code can be dealt with.

Furthermore, in the above described configuration, control signals of the mask circuits 1217 and 1219 use the output of the detector 1215, and this detector 1215 refers to the subtraction result of the subtracter 1211. However, for enhancing this part of process, it is also possible to compare the output of the second register 1707 directly with the output of the third register 1709 and use the result of the comparison as the above described control signal (substitute for the signal 1216).

Also, as in the case of the thirteenth embodiment described above, the increment circuit 1805 performing addition of the carry signal can be replaced with the exclusive-OR element group 1901 (See FIG. 22).

[Sixteenth Embodiment]

Figure 25:
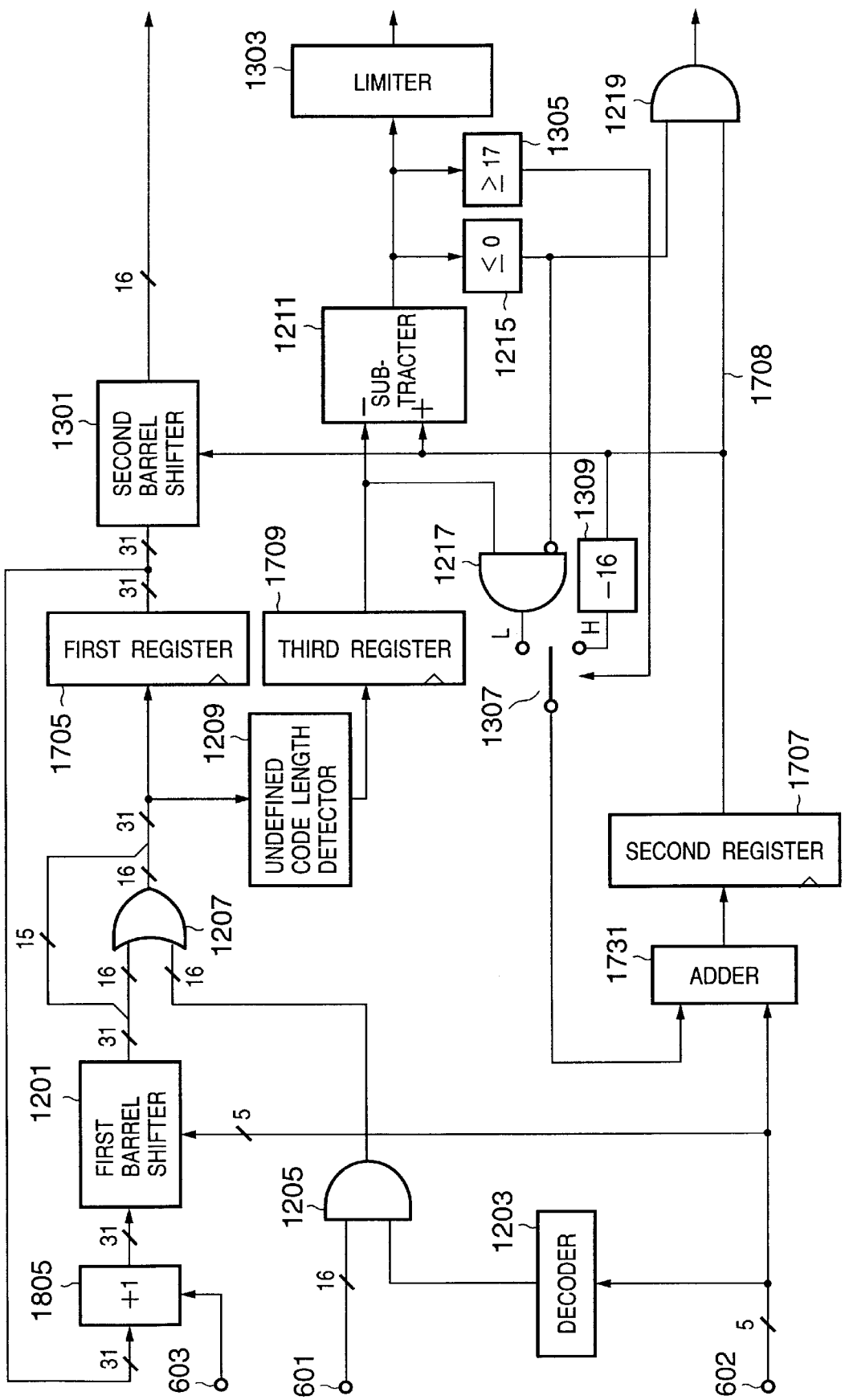
FIG. 25 is a block diagram showing a configuration of the defined/undefined code separator according to a sixteenth embodiment.

FIG. 25 is a block diagram showing the configuration of the defined code/undefined code separator according to the sixteenth embodiment.

The sixteenth embodiment also deals with input of the rear-packed variable length code, and the input variable length code has maximum 16, and the concatenated code length is maximum 31 bits, but for the defined code, only 16 can be outputted at the maximum in one cycle.

In FIG. 25, reference numeral 1301 denotes a second barrel shifter for shifting concatenated codes based on concatenated code length information. The output bus width of the second barrel shifter 1301 is 16. Also, the reference numeral 1303 denotes a limiter limiting input values in the range of from a negative number to 31 to values in the range of from 0 to 16 and outputting the same, reference numeral 1305 denotes a detector detecting that the input value is larger than or equal to 17, reference numeral 1307 denotes a selector switching two signals to each other based on the detection result of the detector 1305, and reference numeral 1309 denotes a minus 16 circuit for subtracting 16 from the input value. Furthermore, other components have functions of the components with identical numbers in the configuration (FIG. 25) of the above described fifteenth embodiment.

In the sixteenth embodiment, since the output bus width of the barrel shifter 1301 is only 16, the maximum defined bit length that can be outputted in one cycle is 16. If the output value of the subtracter 1211 is larger than or equal to 1, this value represents the code length of the defined code, and the defined code cannot be fully outputted in one cycle when this value is larger than 16. Then, the output value of the defined code length is limited to 16 with the limiter 1303, and is outputted, and in accordance therewith, a value that is sent to the adder 1731 as a feedback is controlled.

When it is by the detector 1305 detected that the value of the subtracter 1211 is larger than or equal to 17, '1' is outputted from the detector 1305, and a value obtained by subtracting 16 from the output of the second register 1707, namely the output of the minus 16 circuit 1309 is selected as an input of the adder 1731, in the selector 1307. This corresponds the fact that the defined code of 16 is outputted, whereby the concatenated code length is decreases by 16.

Operations of respective units thereafter, or operations when the selector 1307 is located at the L side are just same as those of the fifteenth embodiment described above, and description thereof is thus omitted.

[Seventeenth Embodiment]

Figure 26:
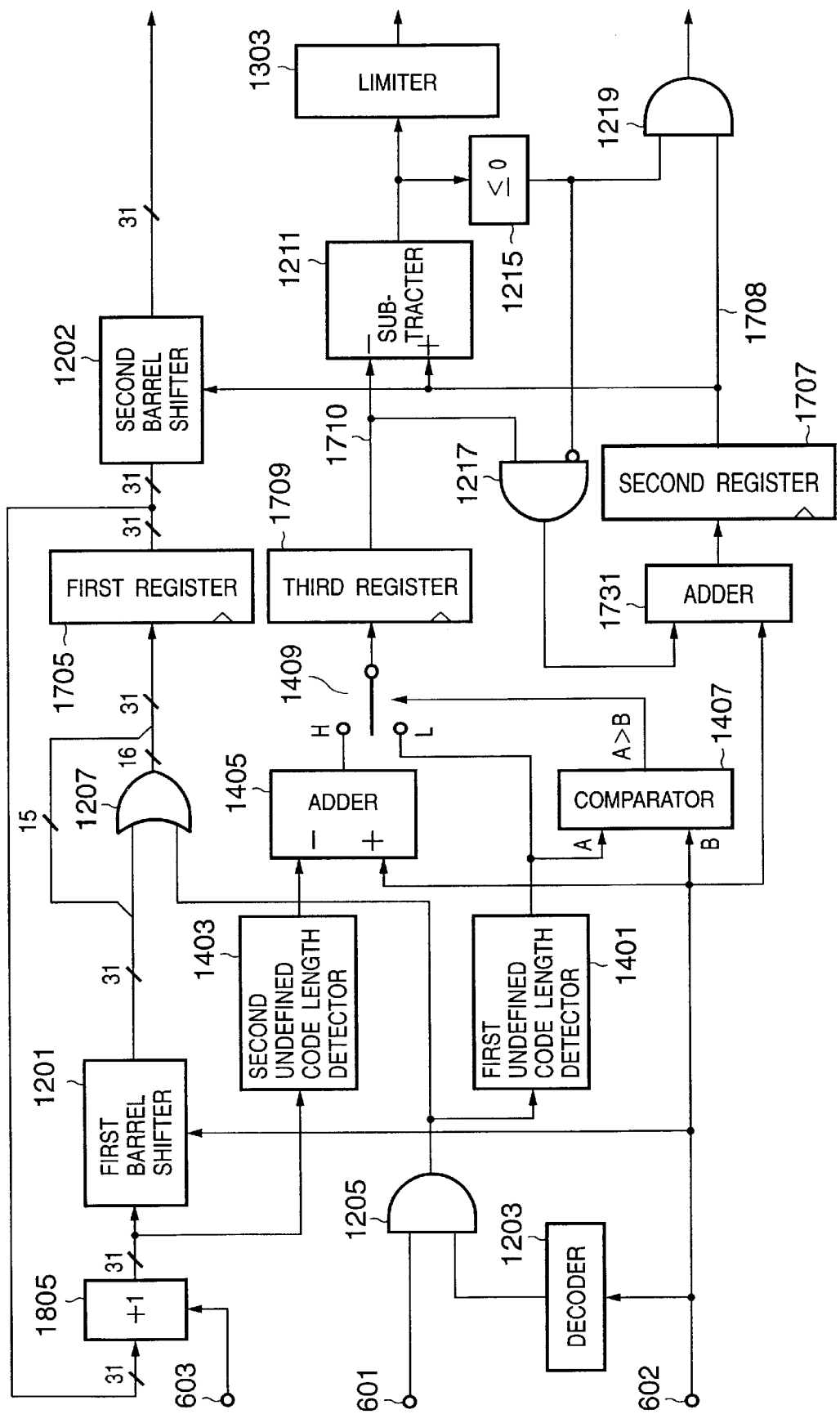
FIG. 26 is a block diagram showing a configuration of the defined/undefined code separator according to a seventeenth embodiment.

FIG. 26 is a block diagram showing the configuration of the defined code/undefined code separator according to the seventeenth embodiment.

The seventeenth embodiment also deals with input of the rear-packed variable length code, and the input variable length code has maximum 16, the concatenated code length is maximum 31 bits, and the output of the defined code has maximum 31 bits.

In FIG. 26, reference numeral 1401 denotes a first undefined code length detector detecting the undefined code length in the input variable length code, reference numeral 1403 denotes a second undefined code length detector detecting the undefined code length in the concatenated code, reference numeral 1405 denotes an adder adding the input variable code length to the output of the second undefined code length detector, reference numeral 1407 denotes a comparator comparing the output of the first undefined code length detector with the input variable length code length, and reference numeral 1409 denotes a selector selecting any one of the addition result of the adder 1405 and the output of the first undefined code length detector 1401. Furthermore, other components have functions same as those of components with identical numbers in the fifteenth embodiment (FIG. 24).

The difference between the seventeenth embodiment and the fifteenth embodiment is in the method of detecting the undefined code length in the concatenated code.

In the above described fifteenth embodiment, the undefined code length is detected after the process of shifting the concatenated code and the process of concatenating a new variable length code, and delay time due to this detection process may hinder high speed operations of the code separator.

Then, in the seventeenth embodiment, the undefined code length detection process is carried out in parallel with the concatenated code shifting process and variable length code concatenating process. Thereby, the delay time for the above described detection process can be reduced apparently, thus making it possible to enhance the speed of processes.

In this embodiment, for carrying out the undefined code length detection process in parallel with the concatenated code shifting process and the process of concatenating a new variable length code, two undefined code length detectors are provided, one of which is used for detecting the undefined code length in the input variable length code, and another of which is used for detecting the undefined code length in the concatenated code after the carry signal is added.

The following two cases will now be considered separately.
- (s1) At least one bit of '0' exists in the input variable length code.
- (s2) No bit of '0' exists in the input variable length code (all bits are '1').

In the case of (s1), the first undefined code length detector 1401 detecting the undefined code length from the input variable length code operates effectively, and the output of the detector 1401 can be substituted for the output of the undefined code length detector 1209 used in the fifteenth and sixteenth embodiments. In this case, since the output of the first undefined code length detector 1401 takes on a value smaller than or equal to the input code length, the value is detected by the comparator 1407, and based on the detection result, the output of the first undefined code length detector 1401 is selected by the selector 1409, and is determined as the final undefined code length.

In the case of (s2), the first undefined code length detector 1401 detecting the undefined code length from the input variable length code does not operate effectively, and the output value equals (input code length+1). In this case, the bit '0' that should be found by the first undefined code length detector 1401 does not exist in the input code, but exists in the code before concatenating, namely in the input signal of the barrel shifter 1201. (Correctly speaking, there may be cases where it does not exit even in the signal, as described previously. In this case, the output of the subtracter 1211 takes on a negative value, and thus the process condition is changed. For this, adequate explanation has been already presented, and description thereof is thus omitted here.)

Therefore, the undefined code length in the input signal of the barrel shifter 1201 is detected, and a newly inputted code length is added to the detected value by the adder 1405, whereby the undefined code length in the entire concatenated code can be determined. The code length is selected by the selector 1409 as the final undefined code length.

Other operations are similar to those of the fifteenth embodiment.

[Eighteenth Embodiment]

FIG. 27 is a block diagram showing the defined code/undefined code separator according to the eighteenth embodiment.

The eighteenth embodiment also deals with input of the rear-packed variable length code, and the input variable length code has maximum 16, and the concatenated code length is maximum 31 bits, but for the defined code, only 16 can be outputted at the maximum in one cycle.

In FIG. 27, reference numeral 1501 denotes a decoder generating a 31-bit signal based on the output of the third register 1709, and reference numeral 1503 denotes an AND element group computing a logical product between the 31-bit signal and the input carry signal. Other components are same as the components with identical numbers in the sixteenth and thirteenth embodiments. The eighteenth embodiment is same as the sixteenth embodiment in basic configuration and conditions, having applied thereto the method of adding the input carry signal used in the thirteenth embodiment.

If only 16 of defined code can be outputted at the maximum in one cycle, there may be cases where the defined code remains in the concatenated code after output of the defined code (similar to the cases of the above described fourteenth and sixteenth embodiments). Therefore, in the previous description, the method used in the thirteenth embodiment cannot be applied to the process of addition of the input carry signal. However, by adding a few circuits, the method used in the thirteenth embodiment, namely the method in which the exclusive-OR element group 1901 is used in the process of addition of the input carry signal can be applied.

If the input carry signal is '1', the code that should be reversed is only the undefined code. It can be understood that even though both the defined code and undefined code exist in the concatenated code, only the area of the undefined code should be able to be reversed if the area is known. The undefined code is located at the lower side of the 31-bit signal outputted from the first register 1705, and the number of bits of the undefined code usually equal the output value of the undefined code length detector 1209.

The decoder 1501 outputs a 31-bit decode signal whose length equals the maximum concatenated code length, outputting '1' for bits corresponding to the undefined code, and outputting '0' for bits corresponding to other codes. That is, if the value of the undefined code length retained in the third register 1709 equals 7, the output is "0000000000000000000000001111111", and when the input carry signal is '1', the lower 7 bits in the 31-bit signal are reversed by the exclusive-OR element group 1901.

When the input carry signal is '0', all the bits of the above described 31-bit signal are masked to '0' by the AND element group 1503, and thus the concatenated code is passed through the exclusive-OR element group 1901 without being reversed at all.

The value of the undefined code length retained in the third register 1709 may be larger that the value of the concatenated code length retained in the second register 1707 (see description of the sixteenth embodiment), and this is due to the fact that the undefined code length detector 1209 detects the undefined code outputted as undefined code length information. In this case, codes other than the targeted undefined code may be reversed, but this causes no problems because:
- they are previously outputted codes; and
- the code that is reversed is not the defined code but only the undefined code.

As described above, according to the eleventh to eighteenth embodiments, the variable length code that is supplied along with the carry signal can be divided into the undefined code varying depending on the value of the carry signal and the defined code having a defined value irrespective of the value of the carry signal.

The process suitable for the undefined code and the process suitable for the defined code are different from each other as a matter of course, but hitherto even the concept of defined codes and undefined codes has not been presented, and needless to say, a processing method in which each code is separated could not be thought at all.

In this embodiment, for performing processing of length fixation of the variable length code supplied along with the carry signal, the concept of undefined codes varying depending on the value of the carry signal and defined codes having defined values irrespective of the value of the carry signal is introduced, and
- configuration for concatenating variable length codes (e.g. the second barrel shifter 1703, AND element group 1723, first barrel shifter 1701, adder 1726 and decoder 1725 in FIG. 19),
- configuration for incorporating the carry signal in the concatenated code (e.g. the first barrel shifter 1701 and adder 1726 in FIG. 19),
- configuration for counting the total code of the concatenated code (e.g. the adder 1731 and second register 1707 in FIG. 19), and configuration for detecting the defined code length or undefined code length in the concatenated code (e.g. the defined code length detector 1711 in FIG. 19) are used, thereby making it possible to configure a code separator separating the variable length code supplied along with the carry signal into the defined code and the undefined code and outputting the same. Also, the code separator enables processes suitable for respective codes to be carried out.

Furthermore, the above described each embodiment has been described illustrating the case of the carry signal as an example, but the borrow signal can be dealt with in a similar way. In this case, the borrow signal is propagated when bits with 0 values are aligned consecutively, and consecutive "0"s constitute an undefined code, and a bit having the value of 1 defines the code therebefore. That is, conditions for detecting the undefined code and the defined code are reversed, respectively, thereby making it possible to achieve a process dealing with the borrow signal.

Furthermore, in the above described embodiment, the configuration for achieving a data conversion process with hardware, but a part or all of the feature of the above described configuration may be achieved with computer software.

That is, needless to say, the object of the present invention can also be achieved by supplying to a system or apparatus a storage medium (or record medium) having recorded therein the program code of software for achieving the aforesaid features of the embodiments, and making the computer (or CPU and MPU) of the system or apparatus read and execute the program code stored in the storage medium. In this case, the feature of the aforesaid embodiment is achieved by the program code itself read from the storage medium, and the storage medium storing the program code therein constitutes the present invention. Furthermore, needless to say, not only the case where the feature of the aforesaid embodiment is achieved by executing the program code read by the computer, but also the case where based on the instructions of the program code, the operating system (OS) or the like operating on the computer performs a part or all of actual processing, by which the feature of the aforesaid embodiment is achieved is also included.

Furthermore, needless to say, the case is also included where after the program code read from the storage medium is written in a memory provided in feature expansion card inserted in the computer and a feature expansion unit connected to the computer, the CPU or the like provided in the feature expansion card and the feature expansion unit performs a part or all of processing based on the instructions of the program code, whereby the feature of the aforesaid embodiment is achieved.

Also, the present invention may be applied to a system constituted by a plurality of apparatuses (e.g. a host computer, interface apparatus, reader, printer and the like), or may be applied to equipment constituted by one apparatus (e.g. a copier, facsimile apparatus or the like).

As described above, according to the present invention, a variable length code with carry signals can be converted into a variable length code with no carry signals.

As many apparently widely different embodiments of the present invention can be made without departing from the spirit and scope thereof, it is to be understood that the invention is not limited to the specific embodiments thereof except as defined in the claims.

What is claimed is:

1. A data processing apparatus, comprising:

concatenation means for incorporating inputted carry signals in a retained remaining code, and concatenating thereto an inputted variable length code to generate a concatenated code;

outputting means for separating from said concatenated code a defined code portion that is not influenced by the carry signal and outputting the same;

retaining means for retaining an undefined code portion obtained by removing said defined code portion from said concatenated code, as a remaining code for use in said concatenation means;

first acquisition means for acquiring the code length of the undefined code when the whole of said concatenated code is an undefined code; and generating means for generating a predetermined defined code having a code length obtained with said first acquisition means and outputting the same.

2. The apparatus according to claim 1, wherein said retaining means clears said remaining code when the whole of the generated concatenated code becomes an undefined code, and said first acquisition means adds cumulatively the code length of said undefined code.

3. The apparatus according to claim 1, wherein said first acquisition means acquires the code length of the undefined code after the whole of said concatenated code becomes an undefined code and until the carry signal indicating execution of carry-over is inputted.

4. The apparatus according to claim 1, wherein said first acquisition means acquires the code length of the undefined code after the whole of said concatenated code becomes an undefined code and until the variable code including the undefined code portion is inputted.

5. The apparatus according to claim 3, wherein said predetermined defined code generated by said generating means has a bit length equal to the code length acquired with said first acquisition means, in which the leading bit is 1, and all other bits are 0.

6. The apparatus according to claim 4, wherein said predetermined defined code generated by said generating means has a bit length equal to said code length acquired with said first acquisition means, in which the leading bit is 0, and all other bits are 1.

7. The apparatus according to claim 1, further comprising:

second acquisition means for acquiring the code length of said defined code portion, wherein said outputting means outputs the code of said defined code portion and the code length acquired with said second acquisition means.

8. The apparatus according to claim 7, wherein said second acquisition means acquires the code length of said defined code portion by acquiring the code length of the undefined code portion included in said inputted variable length code, and subtracting the same from the code length of said concatenated code.

9. The apparatus according to claim 7, wherein said second acquisition means acquires the code length of said defined code portion by acquiring the code length of the defined code portion included in said inputted variable length code, and adding the same to the code length of the remaining code at that point.

10. The apparatus according to claim 7,
wherein said second acquisition means acquires the code length of the defined code portion and undefined code portion included in said inputted variable length code, adds the code length of the defined code portion to the code length of the remaining code at that point to obtain the code length of said defined code portion, and determines the code length of the undefined portion as the code length of a new remaining code.

11. The apparatus according to claim 10,
wherein in said second acquisition means, the code length of the undefined code portion included in said inputted variable length code is acquired by subtracting the code length of the defined code portion included in the variable length code from the code length of the variable length code.

12. The apparatus according to claim 7,
wherein for the concatenated code obtained with said concatenation means, said second acquisition means counts the code length of the defined code portion included in the concatenated code.

13. The apparatus according to claim 1, further comprising:
limiting means for dividing the code length outputted by said outputting means into predetermined or smaller code lengths and outputting the same.

14. The apparatus according to claim 7, further comprising:
fixed length code generating means for generating a defined code portion outputted from said outputting means and generating a fixed length code based on the code length of the defined code portion.

15. The apparatus according to claim 14, further comprising:
selecting means for outputting the output of the generating means as a fixed length code as long as said predetermined defined code is generated and outputted by said generating means, and outputting the output of said fixed length code generating means as a fixed length code in other cases.

16. The apparatus according to claim 15,
wherein said fixed length code outputting means couples defined codes obtained from said outputting means and outputs the same by a code of predetermined code length, and outputs the value of difference between the code length obtained with this concatenating and the predetermined code length as long as the former is smaller than the latter, and
said outputting means limits the code length of said defined code portion to said value of difference or smaller and outputs the same.

17. The apparatus according to claim 2,
wherein said first acquisition means starts said cumulative addition if the code length of said concatenated code exceeds a predetermined length as long as the whole of said concatenated code is a undefined code.

18. A data processing apparatus, comprising:
concatenation means for incorporating inputted carry signals in a retained remaining code, and concatenating thereto an inputted variable length code to generate a concatenated code;
first outputting means for separating from said concatenated code a defined code portion that is not influenced by the carry signal, and outputting the defined code portion and the code length thereof;
retaining means for retaining an undefined code portion obtained by removing said defined code portion from said concatenated code, as a remaining code for use in said incorporating means;
first acquisition means for acquiring the code length of the defined code if the whole of said concatenated code is an undefined code; and
second outputting means for outputting the code length obtained by said first acquisition means.

19. The apparatus according to claim 18,
wherein said concatenation means comprises:
first shifting means for shifting the concatenated code by the number of bits equivalent to the code length of the defined code portion to remove said defined code portion from said concatenated code;
attaching means for attaching the bit of the carry signal to the head of a newly inputted variable length code;
second shifting means for shifting the code obtained with said attaching means to match the head of the code with the position of the last bit of the code shifted by said shifting means; and
adding means for adding the code obtained with said first shifting means to the code obtained with said second shifting means.

20. The apparatus according to claim 19, further comprising:
mask signal generating means for acquiring the code length of the undefined code portion obtained by removing said defined code portion from said concatenated code, and decoding the same to generate a mask signal; and
masking means for masking with said mask signal the code shifted by said first shifting means, and providing the code to said adding means with bits of the portion other than said undefined code portion being 0.

21. The apparatus according to claim 19, further comprising:
mask signal generating means for decoding a code length inputted along with a variable length code to generate a mask signal; and
masking means for masking the inputted variable length code with said mask signal, and providing the code to said second shifting means with bits of the portion other than the valid portion of the variable length code being 0.

22. The apparatus according to claim 18,
wherein said concatenation means comprises:
first shifting means for shifting the concatenated code by the number of bits equivalent to the code length of the defined code portion to remove said defined code portion from said concatenated code;
first converting means for converting all bits of the insignificant portion of the code obtained with said first shifting means into 1;
adding means for adding 1 to the code obtained with said converting means in accordance with said inputted carry signal;
second converting means for converting all bits of said insignificant portion into 0 to obtain said remaining code;
second shifting means for shifting the inputted variable length code to match the head of the code with the position of the leading bit of the insignificant portion of the remaining code obtained with said second converting means; and
ORing means for ORing the remaining code obtained with said second converting means with the code obtained with said second shifting means.

23. The apparatus according to claim 18, comprising:
first shifting means for shifting the concatenated code by the number of bits equivalent to the code length of the defined code portion to remove said defined code portion from said concatenated code;
reversing means for reversing the code obtained with said first shifting means based on the inputted carry signal;
converting means for converting all bits of the insignificant portion of the code obtained with said reversing means into 0 to obtain said remaining code;
second shifting means for shifting the inputted variable length code to match the head of the code with the position of the leading bit of the insignificant portion of the remaining code obtained with said converting means; and
ORing means for ORing the remaining code obtained with said converting means with the code obtained with said second shifting means.

24. The apparatus according to claim 18, further comprising:
limiting means for limiting the code length of the defined code portion outputted by said first outputting means to a predetermined value or smaller,
wherein of said concatenated code, the portion other than defined code of which code length is limited by said limiting means is treated as an undefined code length.

25. The apparatus according to claim 18,
wherein said concatenation means comprises:
adding means for adding 1 to the concatenated code obtained with said concatenation means in accordance with the inputted carry signal; and
shifting means for shifting the code obtained with said adding means by the code length of a newly inputted variable length code to obtain said remaining code, and
the code obtained with said adding means is ORed with the remaining code obtained with said shifting means to obtain a concatenated code.

26. The apparatus according to claim 25, further comprising:
limiting means for limiting the code length of the defined code portion outputted by said first outputting means to a predetermined value or smaller,
wherein of said concatenated code, the portion other than defined code of which code length is limited by said limiting means is treated as an undefined code length.

27. The data processing apparatus according to claim 18,
wherein if a defined portion exists in the newly inputted variable length code, said first outputting means adds the code length of said remaining code to the code length of the defined portion of the variable length code and outputs the added code length, and
if a defined portion does not exist in the newly inputted variable length code, said second outputting means converts the output by said first outputting means into 0 and outputs the code length of the variable length code.

28. The apparatus according to claim 18,
wherein said concatenation means comprises:
reversing means for reversing said undefined code portion in the concatenated code obtained with said concatenation means in accordance with the inputted carry signal;
shifting means for shifting the concatenated code processed with said reversing means by the code length of the newly inputted variable length code to obtain said remaining code; and
ORing means for ORing said inputted variable length code with the remaining code obtained with said shifting means.

29. A data processing apparatus, comprising:
first encoding means for encoding coding object data to generate a variable length code with carry signals;
first converting means for converting the variable length code including carry signal data generated by said encoding means into a variable length code with no carry signals; and
second converting means for converting the variable length code with no carry signals obtained with said converting means into fixed length data;
wherein said first converting means comprises:
concatenation means for incorporating inputted carry signals in a retained remaining code, and concatenating thereto an inputted variable length code to generate a concatenated code;
outputting means for separating from said concatenated code a defined code portion that is not influenced by the carry signal and outputting the same;
retaining means for retaining an undefined code portion obtained by removing said defined code portion from said concatenated code, as a remaining code for use in said concatenation means;
first acquisition means for acquiring the code length of the undefined code when the whole of said concatenated code is an undefined code; and
generating means for generating a predetermined defined code having a code length obtained with said first acquisition means and outputting the same.

30. The apparatus according to claim 29, further comprising:
second encoding means for encoding coding object data to generate a variable length code with no carry signals; and
selecting means for selecting the output of any one of said first converting means and said second encoding means, and providing the same to said second converting means.

31. A data processing method, comprising:
a concatenating step of incorporating inputted carry signals in a retained remaining code, and concatenating thereto an inputted variable length code to generate a concatenated code;
an outputting step of separating from said concatenated code a defined code portion that is not influenced by the carry signal and outputting the same;
a retaining step of retaining an undefined code portion obtained by removing said defined code portion from said concatenated code, as a remaining code for use in said concatenating step;
a first acquiring step of acquiring the code length of the undefined code when the whole of said concatenated code is an undefined code; and
a generating step of generating a predetermined defined code having a code length obtained by said first acquiring step and outputting the same.

32. The method according to claim 31,
wherein in said retaining step, said remaining code is cleared when the whole of the generated concatenated code becomes an undefined code, and
in said first acquiring step, the code length of said undefined code is cumulatively added.

33. The method according to claim 31,
wherein in said first acquiring step, the code length of the undefined code after the whole of said concatenated code becomes an undefined code and until the carry signal indicating execution of carry-over is inputted is acquired.

34. The method according to claim 31,
wherein in said first acquiring step, the code length of the undefined code after the whole of said concatenated code becomes an undefined code and until the variable code including the undefined code portion is inputted is acquired.

35. The method according to claim 33,
wherein said predetermined defined code generated in said generating step has a bit length equal to the code length acquired in said first acquiring step, in which the leading bit is 1, and all other bits are 0.

36. The method according to claim 34,
wherein said predetermined defined code generated in said generating step has a bit length equal to said code length acquired in said first acquiring step, in which the leading bit is 0, and all other bits are 1.

37. The method according to claim 31, further comprising:
a second acquiring step of acquiring the code length of said defined code portion,
wherein in said outputting step, the code of said defined code portion and the code length acquired in said second acquiring step are outputted.

38. The method according to claim 37,
wherein in said second acquiring step, the code length of said defined code portion is acquired by acquiring the code length of the undefined code portion included in said inputted variable length code, and subtracting the same from the code length of said concatenated code.

39. The method according to claim 37,
wherein in said second acquiring step, the code length of said defined code portion is acquired by acquiring the code length of the defined code portion included in said inputted variable length code, and adding the same to the code length of the remaining code at that point.

40. The method according to claim 37,
wherein in said second acquiring step, the code length of the defined code portion and undefined code portion included in said inputted variable length code are acquired, the code length of the defined code portion is added to the code length of the remaining code at that point to obtain the code length of said defined code portion, and the code length of the undefined portion is determined as the code length of a new remaining code.

41. The method according to claim 40,
wherein in said second acquiring step, the code length of the undefined code portion included in said inputted variable length code is acquired by subtracting the code length of the defined code portion included in the variable length code from the code length of the variable length code.

42. The method according to claim 37,
wherein in said second acquiring step, for the concatenated code obtained in said concatenating step, the code length of the defined code portion included in the concatenated code is counted.

43. The method according to claim 31, further comprising:
a limiting step of dividing the code length outputted in said outputting step into predetermined or smaller code lengths and outputting the same.

44. The method according to claim 37, further comprising:
a fixed length code generating step of generating a defined code portion outputted by said outputting step and generating a fixed length code based on the code length of the defined code portion.

45. The method according to claim 44, further comprising:
a selecting step of outputting the output of the generating step as a fixed length code as long as said predetermined defined code is generated and outputted by said generating step, and outputting the output of said fixed length code generating step as a fixed length code in other cases.

46. The method according to claim 45,
wherein in said fixed length code outputting step, defined codes obtained in said outputting step are concatenated to output the same by a code of predetermined code length, and the value of difference between the code length obtained with this concatenating and the predetermined code length is outputted as long as the former is smaller than the latter, and
in said outputting step, the code length of said defined code portion is limited to said value of difference or smaller, and is outputted.

47. The method according to claim 32,
wherein in said first acquiring step, said cumulative addition is started if the code length of said concatenated code exceeds a predetermined length as long as the whole of said concatenated code is an undefined code.

48. A data processing method, comprising:
a concatenating step of incorporating inputted carry signals in a retained remaining code, and concatenating thereto an inputted variable length code to generate a concatenated code;
a first outputting step of separating from said concatenated code a defined code portion that is not influenced by the carry signal, and outputting the defined code portion and the code length thereof;
a retaining step of retaining an undefined code portion obtained by removing said defined code portion from said concatenated code, as a remaining code for use in said incorporating step;
a first acquiring step of acquiring the code length of the defined code if the whole of said concatenated code is an undefined code; and
a second outputting step of outputting the code length obtained in said first acquiring step.

49. The method according to claim 48,
wherein said concatenating step comprises:
a first shifting step of shifting the concatenated code by the number of bits equivalent to the code length of the defined code portion to remove said defined code portion from said concatenated code;
an attaching step of attaching the bit of the carry signal to the head of a newly inputted variable length code;
a second shifting step of shifting the code obtained in said attaching step to match the head of the code with the position of the last bit of the code shifted in said shifting step; and
an adding step of adding the code obtained in said first shifting step to the code obtained in said second shifting step.

50. The method according to claim 49, further comprising:

a mask signal generating step of acquiring the code length of the undefined code portion obtained by removing said defined code portion from said concatenated code, and decoding the same to generate a mask signal; and a masking step of masking with said mask signal the code shifted in said first shifting step, and providing the code to said adding step with bits of the portion other than said undefined code portion being 0.

51. The method according to claim 49, further comprising:

a mask signal generating step of decoding a code length inputted along with a variable length code to generate a mask signal; and a masking step of masking the inputted variable length code with said mask signal, and providing the code to said second shifting step with bits of the portion other than the valid portion of the variable length code being 0.

52. The method according to claim 48, wherein said concatenating step comprises:

a first shifting step of shifting the concatenated code by the number of bits equivalent to the code length of the defined code portion to remove said defined code portion from said concatenated code;

a first converting step of converting all bits of the insignificant portion of the code obtained in said first shifting step into 1;

an adding step of adding 1 to the code obtained in said converting step in accordance with said inputted carry signal;

a second converting step of converting all bits of said insignificant portion into 0 to obtain said remaining code;

a second shifting step of shifting the inputted variable length code to match the head of the code with the position of the leading bit of the insignificant portion of the remaining code obtained in said second converting step; and an ORing step of ORing the remaining code obtained in said second converting step with the code obtained in said second shifting step.

53. The method according to claim 48, further comprising:

a first shifting step of shifting the concatenated code by the number of bits equivalent to the code length of the defined code portion to remove said defined code portion from said concatenated code;

a reversing step of reversing the code obtained in said first shifting step based on the inputted carry signal;

a converting step of converting all bits of the insignificant portion of the code obtained in said reversing step into 0 to obtain said remaining code;

a second shifting step of shifting the inputted variable length code to match the head of the code with the position of the leading bit of the insignificant portion of the remaining code obtained in said converting step; and an ORing step of ORing the remaining code obtained in said converting step with the code obtained in said second shifting step.

54. The method according to claim 48, further comprising:

a limiting step of limiting the code length of the defined code portion outputted in said first outputting step to a predetermined value or smaller, wherein of said concatenated code, the portion other than defined code of which code length is limited in said limiting step is treated as an undefined code length.

55. The method according to claim 48, wherein said concatenating step comprises:

an adding step of adding 1 to the concatenated code obtained in said concatenating step in accordance with the inputted carry signal; and a shifting step of shifting the code obtained in said adding step by the code length of a newly inputted variable length code to obtain said remaining code, and the code obtained in said adding step is ORed with the remaining code obtained in said shifting step to obtain a concatenated code.

56. The method according to claim 55, further comprising:

a limiting step of limiting the code length of the defined code portion outputted in said first outputting step to a predetermined value or smaller, wherein of said concatenated code, the portion other than defined code of which code length is limited in said limiting step is treated as an undefined code length.

57. The data processing method according to claim 48, wherein in said first outputting step, if a defined portion exists in the newly inputted variable length code, the code length of said remaining code is added to the code length of the defined portion of the variable length code, and is outputted, and in a second outputting step, if a defined portion does not exist in the newly inputted variable length code, the output of said first outputting step is converted into 0, and the code length of the variable length code is outputted.

58. The method according to claim 48, wherein said concatenating step comprises:

a reversing step of reversing said undefined code portion in the concatenated code obtained in said concatenating step in accordance with the inputted carry signal;

a shifting step of shifting the concatenated code processed in said reversing step by the code length of the newly inputted variable length code to obtain said remaining code; and an ORing step of ORing said inputted variable length code with the remaining code obtained in said shifting step.

59. A data processing method, comprising:

a first encoding step of encoding coding object data to generate a variable length code with carry signals;

a first converting step of converting the variable length code including carry signal data generated in said encoding step into a variable length code with no carry signals; and a second converting step of converting the variable length code with no carry signals obtained in said converting step into fixed length data;

wherein said first converting step comprises:

a concatenating step of incorporating inputted carry signals in a retained remaining code, and concatenating thereto an inputted variable length code to generate a concatenated code;

an outputting step of separating from said concatenated code a defined code portion that is not influenced by the carry signal and outputting the same;

a retaining step of retaining an undefined code portion obtained by removing said defined code portion from said concatenated code, as a remaining code for use in said concatenating step;

a first acquiring step of acquiring the code length of the undefined code when the whole of said concatenated code is an undefined code; and a generating step of generating a predetermined defined code having a code length obtained in said first acquiring step and outputting the same.

60. The method according to claim 59, further comprising:

a second encoding step of encoding coding object data to generate a variable length code with no carry signals; and a selecting step of selecting the output of any one of said first converting step and said second encoding step, and providing the same to said second converting step.

61. A computer readable medium storing therein a control program for making a computer execute data processing, the data processing comprising:

a concatenating step of incorporating inputted carry signals in a retained remaining code, and concatenating thereto an inputted variable length code to generate a concatenated code;

an outputting step of separating from said concatenated code a defined code portion that is not influenced by the carry signal and outputting the same;

a retaining step of retaining an undefined code portion obtained by removing said defined code portion from said concatenated code, as a remaining code for use in said concatenating step;

a first acquiring step of acquiring the code length of the undefined code when the whole of said concatenated code is an undefined code; and a generating step of generating a predetermined defined code having a code length obtained by said first acquiring step and outputting the same.

* * * * *

UNITED STATES PATENT AND TRADEMARK OFFICE
CERTIFICATE OF CORRECTION

PATENT NO. : 6,567,019 B2
DATED : May 20, 2003
INVENTOR(S) : Tadayoshi Nakayama

It is certified that error appears in the above-identified patent and that said Letters Patent is hereby corrected as shown below:

Column 2,
Line 39, "couple" should read -- couples --;
Line 40, "output" should read -- outputs --.

Column 3,
Line 43, "16," should read -- 16 bits, --;
Line 44, "16" should read -- 16 bits --.

Column 4,
Line 4, "with in" should read -- within --.

Column 6,
Line 67, "FIG. 17." should read -- FIG. 17; --.

Column 9,
Line 3, "the all the" should read -- all the --.

Column 14,
Line 23, "form" should read -- from --;
Line 26, "in stead" should read -- instead --.

Column 16,
Line 48, ""0111111111"" should read -- "01111111111" --;
Line 57, "16." should read -- 16 bits. --.

Column 17,
Line 18, "described the" should read -- described in the --.

Column 18,
Line 52, "means" should read -- mean --;
Line 53, "functions" should read -- function --.

Column 20,
Line 30, "the" should read -- to the --.

Column 25,
Line 13, "16," should read -- 16 bits, --;
Lines 55 and 57, "16" should read -- 16 bits --;
Line 65, "However," should read -- however, --.

UNITED STATES PATENT AND TRADEMARK OFFICE
CERTIFICATE OF CORRECTION

PATENT NO. : 6,567,019 B2
DATED : May 20, 2003
INVENTOR(S) : Tadayoshi Nakayama

It is certified that error appears in the above-identified patent and that said Letters Patent is hereby corrected as shown below:

Column 26,
Line 35, "16," should read -- 16 bits, --.

Column 27,
Line 2, "IF" should read -- If --;
Line 64, "subtraction" should read -- subtracting --.

Column 28,
Line 44, ""0000000000000111001011011110000"" should read
-- "0000000000000111001011011110000". --.

Column 29,
Lines 47 and 67, "16," should read -- 16 bits, --;
Line 48, "16" should read -- 16 bits --;
Line 53, "16." should read -- 16 bits. --.

Column 30,
Lines 1 and 4, "16." should read -- 16 bits. --;
Lines 5 and 14, "16" should read -- 16 bits --;
Line 15, "decreases" should read -- decreased --, and "16." should read -- 16 bits. --;
Line 25, "16," should read -- 16 bits, --;
Line 39, "result" should read -- results --.

Column 31,
Line 46, "16," should read -- 16 bits, --;
Lines 47 and 60, "16" should read -- 16 bits --.

Column 32,
Line 28, "that" should read -- than --.

UNITED STATES PATENT AND TRADEMARK OFFICE
CERTIFICATE OF CORRECTION

PATENT NO.   : 6,567,019 B2
DATED         : May 20, 2003
INVENTOR(S) : Tadayoshi Nakayama It is certified that error appears in the above-identified patent and that said Letters Patent is hereby corrected as shown below:

Column 38,
Line 15, "data;" should read -- data, --.

Signed and Sealed this

Seventeenth Day of February, 2004

JON W. DUDAS
*Acting Director of the United States Patent and Trademark Office*